United States Patent
Svedberg

(10) Patent No.: US 9,792,922 B2
(45) Date of Patent: Oct. 17, 2017

(54) PYRAMID VECTOR QUANTIZER SHAPE SEARCH

(71) Applicant: TELEFONAKTIEBOLAGET L M ERICSSON (PUBL), Stockholm (SE)

(72) Inventor: Jonas Svedberg, Luleå (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 14/759,864

(22) PCT Filed: Jun. 25, 2015

(86) PCT No.: PCT/SE2015/050743
§ 371 (c)(1),
(2) Date: Jul. 8, 2015

(87) PCT Pub. No.: WO2016/018185
PCT Pub. Date: Feb. 4, 2016

(65) Prior Publication Data
US 2016/0027449 A1     Jan. 28, 2016

Related U.S. Application Data

(60) Provisional application No. 62/029,586, filed on Jul. 28, 2014.

(51) Int. Cl.
*G10L 19/00*       (2013.01)
*G10L 19/038*      (2013.01)
*G10L 19/002*      (2013.01)

(52) U.S. Cl.
CPC ........ *G10L 19/038* (2013.01); *G10L 19/0017* (2013.01); *G10L 19/00* (2013.01); *G10L 19/002* (2013.01); *G10L 2019/0013* (2013.01)

(58) Field of Classification Search
None
See application file for complete search history.

(56) References Cited

U.S. PATENT DOCUMENTS 4,720,861 A * 1/1988 Bertrand ............... G10L 19/08
704/222
5,987,407 A * 11/1999 Wu ......................... G10L 19/26
704/200.1

(Continued)

FOREIGN PATENT DOCUMENTS

JP   2003503740 A   1/2003
JP   2003216189 A   7/2003

(Continued)

OTHER PUBLICATIONS

J. Svedberg, et al., "MDCT Audio Coding with Pulse Vector Quantizers", Proc. ICASSP, Apr. 2015.*

(Continued)

*Primary Examiner* — Richard Zhu
(74) *Attorney, Agent, or Firm* — Rothwell, Figg, Ernst & Manbeck, P.C.

(57) ABSTRACT

An encoder and a method therein for Pyramid Vector Quantizer, PVQ, shape search, the PVQ taking a target vector x as input and deriving a vector y by iteratively adding unit pulses in an inner dimension search loop. The method comprises, before entering a next inner dimension search loop for unit pulse addition, determining, based on the maximum pulse amplitude, $\text{maxamp}_y$, of a current vector y, whether more than a current bit word length is needed to represent $\text{enloop}_y$, in a lossless manner in the upcoming inner dimension loop. The variable $\text{enloop}_y$ is related to an accumulated energy of the vector y. The performing of this method enables the encoder to keep the complexity of the search at a reasonable level.

24 Claims, 10 Drawing Sheets

(56) References Cited

U.S. PATENT DOCUMENTS

| | | | |
|---|---|---|---|
| 2012/0232913 A1* | 9/2012 | Terriberry | G10L 19/038 |
| | | | 704/503 |
| 2014/0358978 A1* | 12/2014 | Valin | H03M 7/3082 |
| | | | 708/201 |

FOREIGN PATENT DOCUMENTS

| | | |
|---|---|---|
| JP | 2004289196 A | 10/2004 |
| JP | 2009522588 A | 6/2009 |
| WO | 2015069177 A1 | 5/2015 |
| WO | 2015072914 A1 | 5/2015 |
| WO | 2015130210 A1 | 9/2015 |

OTHER PUBLICATIONS

S. Shirani, "Vector Quantization", McMaster University Educational Slides.*

Valin et al. "Definition of the Opus Audio Codec" Internet Engineering Task Force (IETF), RFC 6716, 2012, 226 pages.

International Telecommunication Union, ITU-T Telecommunication Standardization Sector of ITU, G.718, "Series G: Transmission Systems and Media, Digital Systems and Networks, Digital terminal equipments—Coding of voice and audio signals" 2008, 257 pages.

Valin et al. "Constrained-Energy Lapped Transform (CELT) Codec draft-valin-celt-codec-02" AVT Working Group, Internet-Draft, 2010, 197 pages.

International Search Report and the Written Opinion of the International Searching Authority dated Sep. 23, 2015, in International Application No. PCT/SE2015/050743, 9 pages.

Valin et al. A Full-Bandwidth Audio Codec with Low Complexity and Very Low Delay EUSIPCO, 2009, 5 pages.

3GPP, 3rd Generation Partnership Project; Technical Specification Group Services and System Aspects; Codec for Enhanced Voice Services (EVS); Detailed Algorithmic Description (Release 12), 3GPP TS 26.445 V12.0.0, 2014, 139 pages.

Summary of Japanese Office Action issued in Japanese Application No. 2015-563093, dated Aug. 1, 2016, 3 pages.

Gersho et al. "Vector Quantization Techniques in Image Compression", Handbook of Visual Communications, U.S.A., Academic Press, Inc., chapter 6, 1995, pp. 189-222.

* cited by examiner

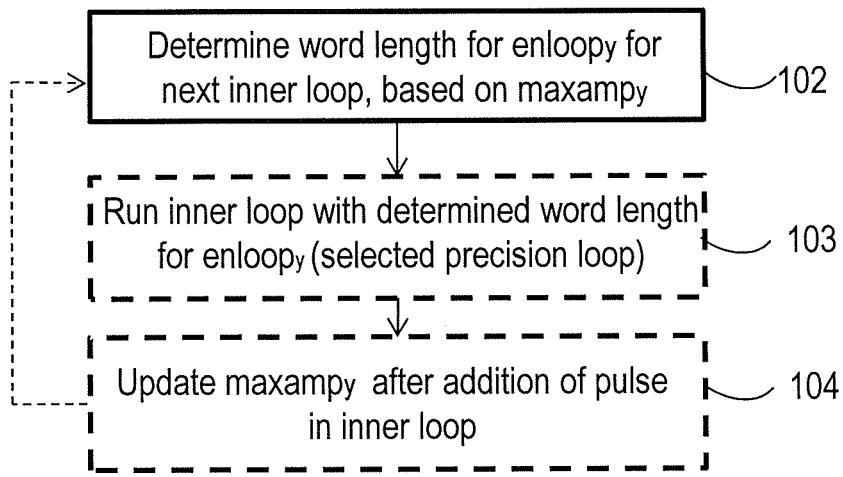
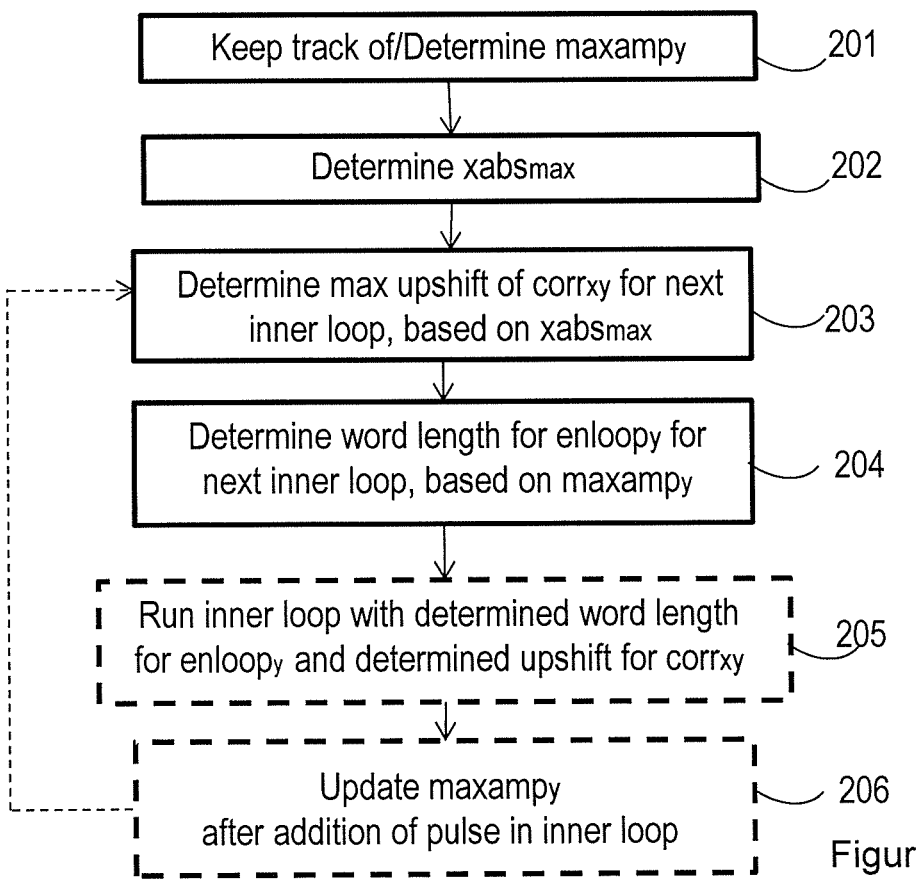

1. 16-bit Linear PCM Samples and Sample Rate (8, 16, 32 or 48 kHz)
2. Encoded audio frame, 50 frames/s, number of bits/frame depending on the EVS codec mode
3. Encoded Silence Descriptor frames (variable frame rate)
4. RTP Payload Packets

US 9,792,922 B2

PYRAMID VECTOR QUANTIZER SHAPE SEARCH

CROSS REFERENCE TO RELATED APPLICATION(S)

This application is a 35 U.S.C. §371 National Phase Entry Application from PCT/SE2015/050743, filed Jun. 25, 2015, designating the United States, and also claims the benefit of U.S. Provisional Application No. 62/029,586, filed Jul. 28, 2014. The disclosures of both applications are incorporated herein in their entirety by reference.

TECHNICAL FIELD

The disclosure herein generally relates to vector quantization (VQ) performed by an encoder.

BACKGROUND

It is known that unconstrained vector quantization is the optimal quantization method for grouped samples, i.e. vectors, of a certain length. However, implementation of unconstrained vector quantization implies high requirements in terms of complexity and memory capacity. A desire to enable implementation of vector quantization also in situations with memory and search complexity constraints, have led to the development of so-called structured vector quantizers. Different structures gives different trade-offs in terms of search complexity and memory requirements. One such method is the so-called gain-shape vector quantization, where the target vector t is represented using a shape vector x and a gain value G:

$$x = \frac{t}{G} \quad \text{(Eq 0)}$$

The concept of gain-shape vector quantization is to quantize the pair {x, G} instead of directly quantizing the target vector t. The gain(G) and shape(x) components are encoded using a shape quantizer which is tuned for the normalized shape input, and a gain quantizer which handles the dynamics of the signal. This gain-shape structure is frequently used in audio coding since the division into dynamics and shape, also denoted fine structure, fits well with the perceptual auditory model. The gain-shape concept can also be applied to Discrete Cosine Transform coefficients or other coefficients used in video coding.

Many speech and audio codecs such as ITU-T G.718 and IETF Opus (RFC 6716) use a gain-shape VQ based on a structured PVQ in order to encode the spectral coefficients of the target speech/audio signal.

The PVQ-coding concept was introduced by R. Fischer in the time span 1983-1986 and has evolved to practical use since then with the advent of more efficient Digital Signal Processors, DSPs. The PVQ encoding concept involves searching for, locating and then encoding a point on an N-dimensional hyper-pyramid with the integer L1-norm of K unit pulses. The so-called L1-norm is the sum of the absolute values of the vector, i.e. the absolute sum of the signed integer PVQ vector is restricted to be exactly K, where a unit pulse is represented by an integer value of "1". A signed integer is capable of representing negative integers, in relation to unsigned which can only represent non-negative integers.

One of the interesting benefits with the structured PVQ-coding approach in contrast to many other structured VQs is that there is no inherent limit in regard of a dimension N, so the search methods developed for PVQ-coding should be applicable to any dimension N and to any K value.

One issue with the structured PVQ-shape quantization is to find the best possible quantized vector using a reasonable amount of complexity. For higher rate speech and audio coding, when the number of allowed unit pulses K, may become very high and the dimension N may also be high, there is even stronger demands on having an efficient PVQ-search, while maintaining the quality, e.g. in terms of Signal to Noise Ratio, SNR, of the reconstructed speech/audio.

Further, the use of the PVQ concept is not restricted to the speech and audio coding area. Currently, the so-called Internet Engineering Task Force, IETF, is pursuing a video codec development where Discrete Cosine Transform, DCT, coefficients are encoded using a PVQ-based algorithm. In video coding it is even more important than in audio coding to have an efficient search procedure, as the number of coefficients may become very large with large displays.

SUMMARY

For a structured PVQ it is desired to enable a computationally efficient shape search which still provides a high Signal to Noise ratio. Especially for implementations involving a fixed precision DSP. The solution provided herein enables a computationally efficient PVQ shape search, by providing an improved PVQ fine search.

According to a first aspect, a method is provided for PVQ shape search, to be performed by an encoder. The PVQ is assumed to involve taking a target vector x as input deriving a vector y by iteratively adding unit pulses in an inner dimension search loop. The provided method comprises, before entering a next inner dimension search loop for unit pulse addition: determining, based on a maximum pulse amplitude, maxamp$_y$, of a current vector y, whether more than a current bit word length is needed to represent, in a lossless manner, a variable, enloop$_y$. The variable enloop$_y$ being related to an accumulated energy of y, in the upcoming inner dimension loop.

According to a second aspect, an encoder is provided, for PVQ shape search. The PVQ is assumed to involve taking a target vector x as input deriving a vector y by iteratively adding unit pulses in an inner dimension search loop. The provided encoder is configured to, before entering a next inner dimension search loop for unit pulse addition: determine, based on a maximum pulse amplitude, maxamp$_y$, of a current vector y, whether more than a current bit word length is needed to represent, in a lossless manner, a variable, enloop$_y$. The variable enloop$_y$ being related to an accumulated energy of y, in the upcoming inner dimension loop.

The method may comprise and the encoder may be configured to, before entering a next inner dimension loop for unit pulse addition: determining, based on a maximum absolute value, xabs$_{max}$, of the input vector, x, a possible upshift, in a bit word, of the next loop's accumulated in-loop correlation value, corr$_{xy}$, between x and the vector y.

The method may comprise and the encoder may be configured to, when more than a current bit word length is needed to represent enloop$_y$, perform the inner loop calculations using a longer bit word length to represent enloop$_y$.

The method may comprise and the encoder may be configured to, when more than a current bit word length is needed to represent enloop$_y$, perform the inner loop calculations using a longer bit word length to represent a squared accumulated in-loop correlation value, $corr_{xy}^2$, between x and the vector y, in the inner loop.

The method may further comprise and the encoder may be configured to, when more than a current bit word length is not needed to represent $enloop_y$:
  performing the inner loop calculations by employing a first unit pulse addition loop using a first bit word length to represent $enloop_y$, and:
  when more than a current bit word length is needed to represent $enloop_y$:
    performing the inner loop calculations by employing a second unit pulse addition loop using a longer bit word length to represent $enloop_y$ than the first unit pulse addition loop.

The determining, based on $maxamp_y$, of whether more than a current bit word length is needed to represent $enloop_y$, may comprise determining characteristics of the case when, in the upcoming inner search loop, the unit pulse is added to the position in y being associated with $maxamp_y$.

The method may further comprise and the encoder may be configured to, in the inner dimension search loop for unit pulse addition:
  determining a position, $n_{best}$, in y for addition of a unit pulse by evaluating a cross-multiplication, for each position n in y, of a correlation and energy value for the current n; and a squared correlation, BestCorrSq and an energy value, bestEn, saved from previous values of n, as:

$$corr_{xy}^2 * bestEn > BestCorrSq * enloop_y$$

where $$\left.\begin{array}{l} n_{best} = n \\ bestEn = enloop_y \\ BestCorrSq = corr_{xy}^2 \end{array}\right\} \text{ when } corr_{xy}^2 * bestEn > BestCorrSq * enloop_y$$

The method may also comprise and the encoder be configured to keep track of $maxamp_y$ when a final value of K, associated with the target vector x, exceeds a threshold value. Here the method may comprise and the encoder may be configured to calculate an energy margin, en_margin, only if a current value of K exceeds a threshold value which may be the threshold value mentioned in the preceding sentence.

According to a third aspect, a communication device is provided, which comprises an encoder according to the second aspect.

According to a fourth aspect, a computer program is provided, which comprises instructions which, when executed on at least one processor, such as a DSP, cause the at least one processor to carry out the method according to the first aspect.

According to a fifth aspect, a carrier is provided, containing the computer program according to the fourth aspect, the carrier being one of an electronic signal, optical signal, radio signal, or computer readable storage medium.

According to a sixth aspect, and encoder is provided, which is configured for PVQ shape search; the PVQ taking a target vector x as input and deriving a vector y by iteratively adding unit pulses in an inner dimension search loop. The provided encoder comprises a first determining unit for, before entering a next inner dimension search loop for unit pulse addition, determining, based on a maximum pulse amplitude, $maxamp_y$, of a current vector y, whether more than a current bit word length is needed to represent, in a lossless manner, a variable, $enloop_y$, related to an accumulated energy of y, in the upcoming inner dimension loop.

The Encoder according to the sixth aspect may comprise a second determining unit for, before entering a next inner dimension loop for unit pulse addition, determining, based on a maximum absolute value, $xabs_{max}$, of the input vector, x, a possible upshift, in a bit word, of the next loop's accumulated in-loop correlation value, $corr_{xy}$, between x and the vector y.

The Encoder according to the sixth aspect may comprise a fine search unit for performing the inner loop calculations using a longer bit word length to represent $enloop_y$, when more than a current bit word length is needed to represent $enloop_y$.

The Encoder according to the sixth aspect may comprise a fine search unit for:
  performing the inner loop calculations by employing a first unit pulse addition loop using a first bit word length when more than a current bit word length is not needed to represent $enloop_y$, and:
  performing the inner loop calculations by employing a second unit pulse addition loop using a longer bit word length than the first unit pulse addition loop when more than a current bit word length is needed to represent $enloop_y$.

The Encoder according to the sixth aspect may comprise a fine search unit for
  performing the inner loop calculations by employing a first unit pulse addition loop, having a certain precision, when more than a current bit word length is not needed to represent $enloop_y$; and to
  performing the inner loop calculations by employing a second unit pulse addition loop, having a higher precision than the first unit pulse addition loop, when more than a current bit word length is needed to represent $enloop_y$.

The Encoder according to the sixth aspect may be configured to perform the determining, based on $maxamp_y$, of whether more than a current bit word length is needed to represent $enloop_y$, by determining characteristics of the case when, in the upcoming inner search loop, the unit pulse is added to the position in y being associated with $maxamp_y$.

The Encoder according to the sixth aspect may comprise a fine search unit for, in the inner dimension search loop for unit pulse addition:
  determining a position, $n_{best}$, in y for addition of a unit pulse by evaluating a cross-multiplication, for each position n in y, of a correlation and energy value for the current n; and a correlation, BestCorrSq, and energy value, bestEn, saved from previous values of n, as:

$$corr_{xy}^2 * bestEn > BestCorrSq * enloop_y$$

where $$\left.\begin{array}{l} n_{best} = n \\ bestEn = enloop_y \\ BestCorrSq = corr_{xy}^2 \end{array}\right\} \text{ when } corr_{xy}^2 * bestEn > BestCorrSq * enloop_y$$

The Encoder according to the sixth aspect may comprise a storing unit for keeping track of $maxamp_y$ when a number of final unit pulses, K, associated with the target vector x, exceeds a threshold value.

According to a seventh aspect, a communication device is provided, which comprises an encoder according to the sixth aspect.

BRIEF DESCRIPTION OF DRAWINGS

The foregoing and other objects, features, and advantages of the technology disclosed herein will be apparent from the following more particular description of embodiments as illustrated in the accompanying drawings. The drawings are not necessarily to scale, emphasis instead being placed upon illustrating the principles of the technology disclosed herein.

FIGS. 1-4 illustrate a method for PVQ shape search (fine search), according to different exemplifying embodiments.

DETAILED DESCRIPTION

Figure 3:
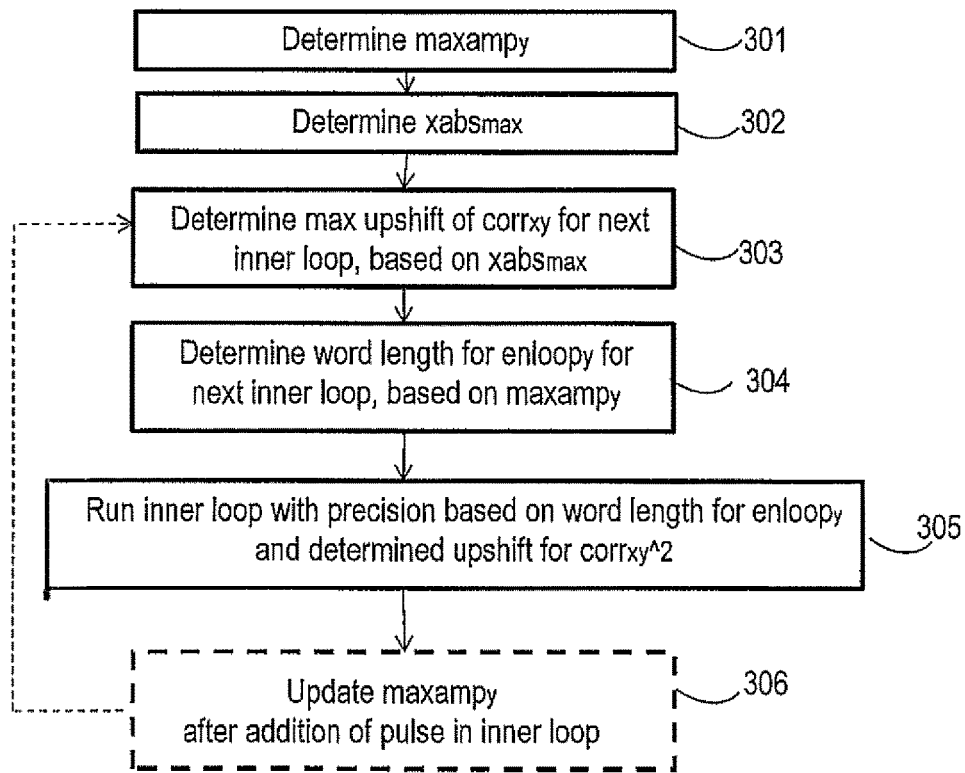

In floating point arithmetic there is no major issue related to establishing the dynamics of inner loop PVQ shape search iteration parameters, however in fixed precision DSPs with e.g. 16/32 bit limited accumulators (a register in which intermediate arithmetic and/or logic results are stored) and variables, it is very important to employ efficient search methods where the limited dynamic range of the DSP variables is maximized and the precision is maximized, while being able to use as many of available fast limited-dynamic range DSP operations as possible.

The term "precision" above refers to being able to represent as small numbers as possible, i.e. the number of bits after the decimal point for a specific word length. Another way of saying it is that the precision corresponds to the resolution of the representation, which again is defined by the number of decimal or binary digits. The reason for that the precision in embodiments described below may be said to correlate with the number of bits after the decimal point and not necessarily with the word length itself is that in fixed point arithmetics, there may be different precisions for the same word length. For example, the data formats 1Q15 and 2Q14 both have word length 16, but the first one has 15 bits after the decimal point and the other 14 bits. The smallest number representable would then be $2^{-15}$ and $2^{-14}$ respectively.

A way of performing pyramid vector quantization of the shape is disclosed in section 3.2 of Valin et. al, "A full-bandwidth audio codec with low complexity and very low delay", EUSIPCO, 2009. In this document an MDCT codec is presented where the details, i.e. the shape, in each band are quantized algebraically using a spherical codebook and where the bit allocation is inferred from information shared between the encoder and the decoder. Aspects and embodiments of the disclosure of this application at least loosely relate to how to do a search according to Equations 4-7 in Valin et. al., in an efficient way in fixed point limited to e.g. 16/32 bit arithmetic instead of float values as in Valin et. al.

In some aspects and embodiments disclosed hereinafter, given a target vector $x(n)$ (t in Equation 0) of certain dimension N, and given a certain number of unit pulses K, the shape is analyzed and a suitable reconstruction vector $x_q(n)=\text{func}(y(n))$, which minimizes the shape quantization error, and thus maximizes a perceived quality e.g. in case of audio coding, is determined. At least some of the aspects and embodiments are implemented to aim for a finding of the optimal constellation of K unit pulses, in a vector $y(n)$ which needs to adhere to the L1 norm, while keeping the complexity under control, i.e. as low as practically possible.

Instead of using prior art open loop methods to determine approximate values for the inner loop dynamic range and accumulator precision, some of the aspects and embodiments are designed to use low cost, in terms of DSP cycles needed and in terms of additional Program Read-Only Memory (ROM) needed, "near optimal" pre-analysis of the worst case numerator and/or worst case denominator before starting the costly evaluations of the PVQ-shape distortion quotient in the innermost search loop. The "near-optimal" pre-analysis is not targeting to scale the values to the exact optimal maximum dynamic range, but instead the pre-analysis determines the near-optimal power of 2 scale factor, as power of 2 scaling may be implemented as shifts of a binary number and such shifts have a low cost in DSP cycles and in DSP ROM.

The denominator precision selection is perceptually motivated as spectrally peaky regions will be allocated more precision than flatter regions.

While some of the main concepts described in this disclosure cover various modifications and alternative constructions, embodiments of the aspects are shown in drawings and exemplary code and will hereinafter be described in detail.

PVQ-search General Optimization Introduction

An L1-norm structured PVQ-quantizer allows for several search optimizations, where a primary optimization is to move the target to the all positive "quadrant" (could also be denoted orthant or hyper octant) in N-dimensional space and a second optimization is to use an L1-norm projection as a starting approximation for $y(n)$. An L1-norm of K for a PVQ(N,K) means that the absolute sum of all elements in the PVQ-vector $y(n)$ has to be K, just as the absolute sum of all elements in the target shape vector $x(n)$.

A third optimization is to iteratively update $Q_{PVQ}$ quotient terms $\text{corr}_{xy}^2$ and $\text{energy}_y$, instead of re-computing Eq. 4 (below) over the whole vector space N, for every candidate change to the vector $y(n)$ in pursuit of reaching the L1-norm K, which is required for a subsequent indexing step.

The above three major optimization steps are optimizations which generally may exist in past PVQ-implementations such as CELT and IETF-Opus, and partly in G.718, however for the completeness of the description of aspects and embodiments, these steps are also briefly outlined below.

Efficient PVQ Vector Shape Search

Figure 12:
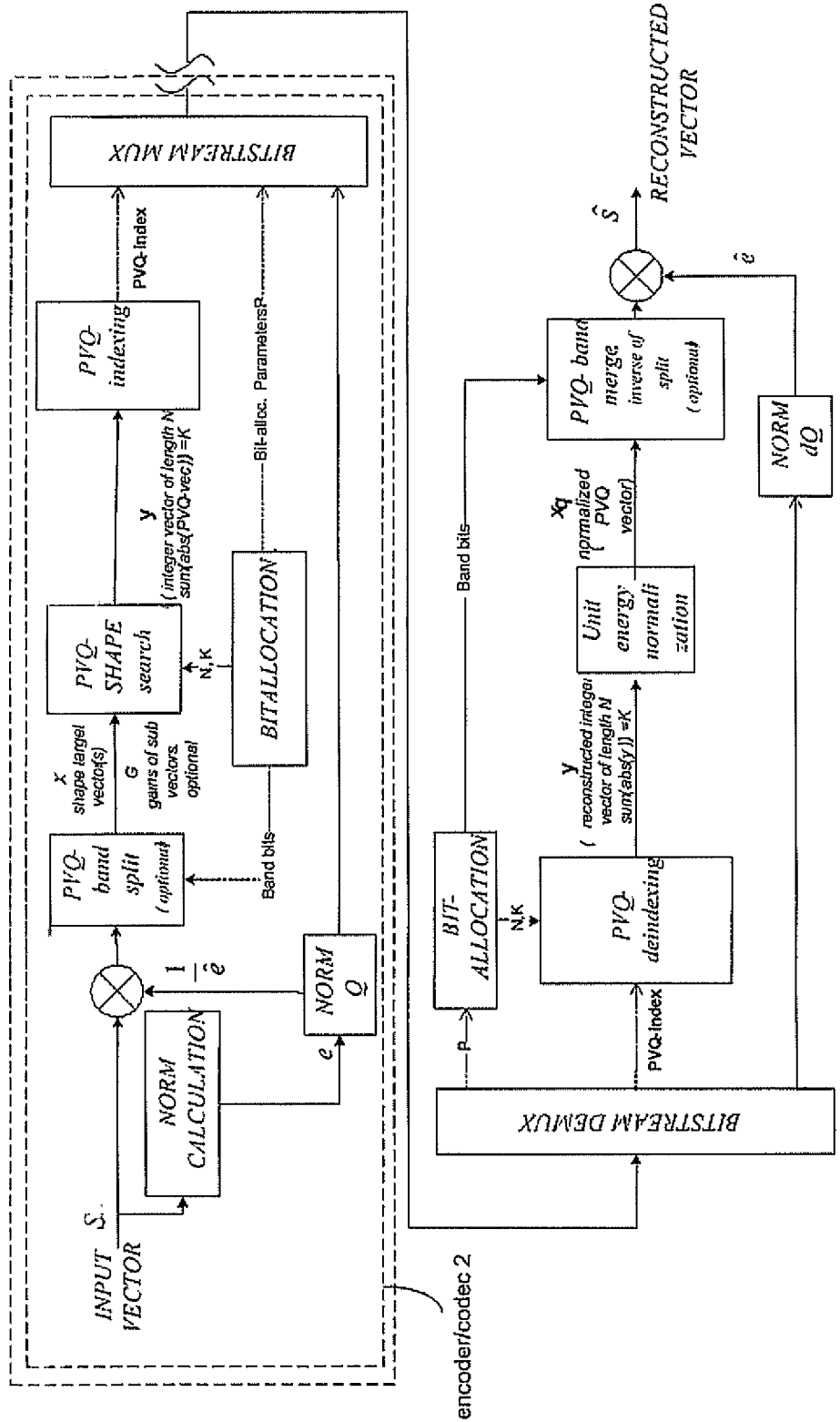
FIG. 12 shows an example of a PVQ audio coding system, where at least one part of the system is comprised in an encoder and/or codec which in turn is comprised in a communication device, such as a mobile phone.

An overview of an audio encoding and decoding system applying an embodiment of the herein proposed PVQ shape search can be seen in FIG. 12. A general shape search using a pyramid projection followed by a fine (shape) search flow can be seen e.g. in FIG. 5. Another embodiment of a fine search part of a shape search is depicted in FIG. 6. A PVQ shape search may comprise a pyramid projection and a fine search. When no pyramid projection is applied, the shape search only comprises the fine search. Therefore, "fine search" and "shape search" may sometimes be used interchangeably herein, since the fine search is a part of the shape search, and when there is no initial coarse search, by pyramid projection, performing of the shape search is even the same thing as performing the fine search. In other words, the fine search may sometimes be or constitute the shape search, and when pyramid projection is applied, the fine search is a part of the shape search.

PVQ-search Introduction

The goal of the PVQ(N,K) search procedure is to find the best scaled and normalized output vector $x_q(n)$. $x_q(n)$ is defined as:

$$x_q = \frac{y}{\sqrt{y^T y}} \quad \text{(Eq 1)}$$

Where $y=y_{N,K}$ is a point on the surface of an N-dimensional hyper-pyramid and the L1 norm of $y_{N,K}$ is K. In other words, $y_{N,K}$ is the selected integer shape code vector of size N, also denoted dimension N, according to:

$$y_{N,K} = \left\{ e : \sum_{i=0}^{N-1} |e_i| = K \right\} \quad \text{(Eq 2)}$$

That is, the vector $x_q$ is the unit energy normalized integer sub vector $y_{N,K}$. The best y vector is the one minimizing the mean squared shape error between the target vector $x(n)$ and the scaled normalized quantized output vector $x_q$. This is achieved by minimizing the following search distortion:

$$d_{PVQ} = -x^T x_q = -\frac{(x^T y)}{\sqrt{y^T y}} \quad \text{(Eq 3)}$$

Or equivalently, by squaring numerator and denominator, maximizing the quotient $Q_{PVQ}$:

$$Q_{PVQ} = \frac{(x^T y)^2}{y^T y} = \frac{(\text{corr}_{xy})^2}{\text{energy}_y} \quad \text{(Eq 4)}$$

where $\text{corr}_{xy}$ is the correlation between x and y. In the search of the optimal PVQ vector shape y(n) with L1-norm K, iterative updates of the $Q_{PVQ}$ variables are made in the all positive "quadrant" in N-dimensional space according to:

$$\text{corr}_{xy}(k,n) = \text{corr}_{xy}(k-1) + 1 \cdot x(n) \quad \text{(Eq 5)}$$

$$\text{energy}_y(k,n) = \text{energy}_y(k-1) + 2 \cdot 1^2 \cdot y(k-1,n) + 1^2 \quad \text{(Eq 6)}$$

where $\text{corr}_{xy}(k-1)$ signifies the correlation achieved so far by placing the previous k−1 unit pulses, and $\text{energy}_y(k-1)$ signifies the accumulated energy achieved so far by placing the previous k−1 unit pulses, and y(k−1, n) signifies the amplitude of y at position n from the previous placement of k−1 unit pulses. To further speed up the in-loop iterative processing the energy term $\text{energy}_y(k)$ is scaled down by 2, thus removing one multiplication in the inner-loop.

$$\text{enloop}_y(k,n) = \text{energy}_y(k,n)/2, \Rightarrow \text{enloop}_y(k,n) = \text{enloop}_y(k-1) + y(k-1,n) + 0.5 \quad \text{(Eq 7)}$$

where $\text{enloop}_y(k,n)$ is the preferred energy variable used and accumulated inside the innermost unit pulse search loop, as its iterative update requires one multiplication less than $\text{energy}_y(k,n)$.

$$Q_{PVQ}(k,n) = \frac{\text{corr}_{xy}(k,n)^2}{\text{enloop}_y(k,n)} \quad \text{(Eq 8)}$$

The best position $n_{best}$ for the k'th unit pulse, is iteratively updated by increasing n from 0 to N−1:

$$n_{best} = n, \text{if } Q_{PVQ}(k,n) > Q_{PVQ}(k,n_{best}) \quad \text{(Eq 9)}$$

To avoid costly divisions, which is especially important in fixed point arithmetic, the $Q_{PVQ}$ maximization update decision is performed using a cross-multiplication of the saved best squared correlation numerator bestCorrSq and the saved best energy denominator bestEn so far, which could be expressed as:

$$\left. \begin{array}{l} n_{best} = n \\ bestCorrSq = \text{corr}_{xy}(k,n)^2 \\ bestEn = \text{enloop}_y(k,n) \end{array} \right\}, \quad \text{(Eq 10)}$$

if $\text{corr}_{xy}(k,n)^2 \cdot bestEn > bestCorrSq \cdot \text{enloop}_y(k,n)$ The iterative maximization of $Q_{PVQ}(k, n)$ may start from a zero number of placed unit pulses or from an adaptive lower cost pre-placement number of unit pulses, based on an integer projection to a point below the K'th-pyramid's surface, with a guaranteed undershoot of unit pulses in the target L1 norm K.

PVQ Search Preparation Analysis

Due to the structured nature of the $y_{N,K}$ PVQ integer vector, where all possible sign combinations are allowed and it is possible to encode all sign combinations, as long as the resulting vector adheres to the L1 norm of K unit pulses, the search is performed in the all positive first "quadrant" (the reason for the citation marks on "quadrant" is that a true quadrant only exists when N=2, and N may here be more than 2). Further, as realized by the inventor, to achieve as a high accuracy as possible for a limited precision implementation, the maximum absolute value $xabs_{max}$ of the input signal x(n) may be pre-analyzed for future use in the setup of the inner loop correlation accumulation procedure.

$$xabs(n) = |x(n)|, \text{for } n=0, \ldots, N-1 \quad \text{(Eq 11)}$$

$$xabs_{max} = \max(xabs_0, \ldots, xabs_{N-1}) \quad \text{(Eq 12)}$$

Handling of Very Low Energy Targets and Very Low Energy Sub-Vectors

In case the input target vector (x in Eq. 3 or t in Eq. 0) is an all zero vector and/or the vector gain (e.g. G in Eq. 0) is very low, the PVQ-search may be bypassed, and a valid PVQ-vector y may be deterministically created by assigning half of the K unit pulses to the first position $$\left( y[0] = \left\lfloor \frac{K}{2} \right\rfloor \right)$$

and the remaining unit pulses to the last position (y[N−1]=y[N−1]+(K−y[0])).

The term "very low energy targets" and "very low vector gain" is in one embodiment as low as zero, as illustrated in the exemplary ANSI C-code disclosed below, where the corresponding code is:

```
IF( L_xsum == 0 || neg_gain == 0 )
{    /* zero input or zero gain case */
```

However, it may also be less than or equal to epsilon, or EPS, where EPS is the lowest value which is higher than zero and which is regarded as being worth representing in a selected precision. For example, in a precision Q15 in a signed 16 bit word, the sub-vector gain becomes less or equal to EPS ½^15=1/32768 (e.g. vector gain less or equal to 0.000030517578125), and in case of precision Q12 in a signed 16 bit word for target vector x(n), then the "very low" value becomes EPS=(½^12), e.g. sum (abs (x(n))) less or equal to 0.000244140625. In one embodiment of fixed-point DSP arithmetics with 16 bit word, an unsigned integer format may take any integer value from 0 to 65546, whereas a signed integer may take the value of −32768 to +32767. Using unsigned fractional format, the 565536 levels are spread uniformly between 0 and +1, whereas in a signed fractional format embodiment the levels would be equally spaced between −1 and +1.

By applying this optional step related to zero-vectors and low gain values, the PVQ-search complexity is reduced and the indexing complexity is spread/shared between encoder indexing and decoder de-indexing, i.e. no processing is "wasted" for searching a zero target vector or a very low target vector which would in any way be scaled down to zero.

Optional PVQ Pre-search Projection

If the pulse density ratio K/N is larger than 0.5 unit pulses per coefficient, e.g. modified discrete cosine transform coefficient, a low cost projection to the K−1 sub pyramid is made and used as a starting point for y. On the other hand, if the pulse density ratio is less than 0.5 unit pulses per coefficient, the iterative PVQ-search will start off from 0 pre-placed unit pulses. The low cost projection to "K−1" is typically less computationally expensive in DSP cycles than repeating the unit pulse inner loop search K−1 times. However, a drawback of the low cost projection is that it will produce an inexact result due to the N-dimensional floor function application. The resulting L1-norm of the low cost projection using the floor function may typically be anything between "K−1" to roughly "K−5", i.e. the result after the projection needs to be fine searched to reach the target norm of K.

The low cost projection is performed as:

$$proj_{fac} = \frac{K-1}{\sum_{n=0}^{n=N-1} xabs(n)} \quad (Eq\ 13)$$

$$Y(n)=y_{start}(n)=\lfloor xabs(n) \cdot proj_{fac} \rfloor \text{ for } n=0, \ldots, N-1 \quad (Eq\ 14)$$

If no projection is made, the starting point is an all zeroed y(n) vector. The DSP cost of the projection in DSP cycles is in the neighborhood of N(absolute sum)+25 (the division)+2N(multiplication and floor) cycles.

In preparation for the fine search to reach the K'th-pyramid's surface the accumulated number of unit pulses pulse$_{tot}$, the accumulated correlation corr$_{xy}$(pulse$_{tot}$) and the accumulated energy energy$_y$(pulse$_{tot}$) for the starting point is computed as:

$$pulse_{tot} = \sum_{n=0}^{n=N-1} y(n) \quad (Eq\ 15)$$

$$corr_{xy}(pulse_{tot}) = \sum_{n=0}^{n=N-1} y(n) \cdot xabs(n) \quad (Eq\ 16)$$

$$energy_y(pulse_{tot}) = \sum_{n=0}^{n=N-1} y(n) \cdot y(n) = \|y\|_{L2} \quad (Eq\ 17)$$

$$enloop_y(pulse_{tot}) = energy_y(pulse_{tot})/2 \quad (Eq\ 18)$$

PVQ Fine Search

The solution disclosed herein is related to the PVQ fine search (which constitutes or is part of the PVQ-shape search, as previously described). What has been described in the preceding sections is mainly prior art PVQ, except for the upfront determining of xabs$_{max}$, which will be further described below. The final integer shape vector y(n) of dimension N must adhere to the L1 norm of K pulses. The fine search is assumed to be configured to start from a lower point in the pyramid, i.e. below the K'th pyramid, and iteratively find its way to the surface of the N-dimensional K'th-hyperpyramid. The K-value in the fine search can typically range from 1 to 512 unit pulses.

The inventor has realized, that in order to keep the complexity of the search and PVQ indexing at a reasonable level, the search may be split into two main branches, where one branch is used when it is known that the in-loop energy representation of y(n) will stay within a signed, or unsigned, 16 bit word during a next inner search loop iteration, and another branch is used when the in-loop energy may exceed the dynamic range of a 16 bit word during a next inner search loop iteration.

Fixed Precision Fine Search for a Low Number of Unit Pulses

When the final K is lower than or equal to a threshold of $t_p=127$ unit pulses, the dynamics of the energy$_y$(K) will always stay within 14 bits, and the dynamics of the 1 bit upshifted enloop$_y$(K) will always stay within 15 bits. This allows use of a signed 16 bit word for representing every enloop$_y$(k) within all the fine pulse search inner loop iterations up to k=K. In other words, there will be no need for a word bit length exceeding 16 bits for representing energy$_y$(K) or enloop$_y$(K) in any fine pulse search inner loop iteration when K<127.

In the case of the availability of efficient DSP Multiply, MultiplyAdd (multiply-add) and MultiplySubtract (multiply-subtract) operators for unsigned 16 bit variables, the threshold can be increased to $t_p=255$, as then enloop$_y$(K) will always stay within an unsigned 16 bit word. MultiplyAdd is here in one embodiment multiply-add instructions or equivalent operations to multiply data values representing audio and video signals by filter or transform values and accumulate the products to produce a result. MultiplySubtract operations are the same as the MultiplyAdd operations, except the adds are replaced by subtracts.

In preparation for the next unit pulse addition, the near optimal maximum possible upshift of the next loop's accumulated in-loop correlation value, corr$_{xy}$, in a signed 32 bit word is pre-analyzed using the previously calculated maximum absolute input value $xabs_{max}$ as:

$$corr_{upshift}=31-\lceil \log 2(corr_{xy}(pulse_{tot})+2\cdot(1\cdot xabs_{max}))\rceil \quad \text{(Eq 19)}$$

This upshift calculated in Eq 19 represents the "worst case", and covers the maximum possible upshift that can be done in the next inner loop, and thus ensures that the most significant information related to correlation will not be lost, or outshifted, during the inner loop iteration, even for the worst case scenario.

This worst case pre-inner loop dynamic analysis can be performed in 2-3 cycles in most DSP architectures using MultiplyAdd and Norm instructions (normalization), and the analysis is always the same independent of the dimension N. In an ITU-T G.191 virtual 16/32-bit DSP the operations in Eq. 19 become: "corr_upshift=norm_l(L_mac(*L_corrxy,1, xabs_max));" with a cost of 2 cycles. It should be noted that norm_l(x) here corresponds to "31−ceil(log 2(x))", and could alternatively be denoted 31−ceil(log 2(x)), where ceil(x) is the so-called ceiling function, mapping a real number to the smallest following integer. More precisely, ceiling(x)=⌈x⌉ is the smallest integer not less than x. For $corr_{upshift}$, the term within the brackets with upper horizontal bar is always a positive number. The $corr_{upshift}$ could alternatively be calculated using a floor function as:

$$corr_{upshift}=30-\lfloor \log 2(corr_{xy}(pulse_{tot})+2\cdot(1\cdot xabs_{max}))\rfloor$$

where floor(x)=⌊x⌋ is the largest integer not greater than x.

Another benefit of the herein suggested approach to near optimal shape search correlation scaling is that the proposed method does not require a pre-normalized target vector x, which will save some additional complexity before starting the shape search.

To make the iterative Eq. 10 update as efficient as possible, the $corr_{xy}(k,n)^2$ numerator may be represented by a 16 bit signed word, even when comprising more information than fits in a 16 bit word, by the following approach.

$$corr_{xy16}(k,n)^2=(Round_{16}((corr_{xy}(pulse_{tot})+2\cdot(1\cdot xabs(n)))\cdot 2^{corr_{upshift}}))^2 \quad \text{(Eq20)}$$

$$\left.\begin{array}{l}n_{best} = n \\ bestCorrSq_{16} = corr_{xy16}(k, n)^2 \\ bestEn_{16} = enloop_y(k, n)\end{array}\right\}, \quad \text{(Eq 21)}$$

if $corr_{xy16}(k, n)^2 \cdot bestEn_{16} > bestCorrSq_{16} \cdot enloop_y(k, n)$ where the function "$Round_{16}$" extracts the top 16 bits of a signed 32 bit variable with rounding. This near optimal upshift (Eq 10) and the use of 16 bit representation of the squared correlation $bestCorrSq_{16}$ enables a very fast inner-loop search using only ~9 cycles for performing the Eq. 21 test and the three variable updates, when using a DSPs optimized Multiply, MultiplyAdd, MultiplySubtract functions.

The location of the next unit pulse in the vector y is now determined by iterating over the n=0, . . . , N−1 possible positions in vector y, while employing equations Eq 20, Eq 6 and Eq 21.

When the best position $n_{best}$ for the unit pulse (in the vector y achieved so far) has been determined, the accumulated correlation $corr_{xy}(k)$, the accumulated inloop energy $enloop_y(k)$ and the number of accumulated unit pulses $pulse_{tot}$ are updated. If there are further unit pulses to add, i.e. when $pulse_{tot}<K$, a new inner-loop is started with a new near optimal $corr_{upshift}$ analysis (Eq.19) for the addition of a next unit pulse.

In total, this suggested approach has a worst case complexity for each unit pulse added to y(n) of roughly 5/N+15 cycles per quantized coefficient. In other words, a loop over a vector of size N for adding a unit pulse has a worst case complexity of about N*(5/N+15) cycles, i.e. 5+15*N cycles.

Fixed Precision Fine Search for a High Number of Unit Pulses

When K is higher than a threshold $t_p$, which in this exemplifying embodiment assuming a 16/32 bit restricted DSP, is $t_p=127$ unit pulses, the dynamics of the parameter $energy_y(K)$ may exceed 14 bits, and the dynamics of the 1 bit upshifted $enloop_y(K)$ may exceed 15 bits. Thus, in order not to use unnecessarily high precision, the fine search is configured to adaptively choose between 16 bit representation and 32 bit representation of the pair $\{corr_{xy}(k,n)^2, enloop_y(k,n)\}$ when K is higher than $t_p$. When K for the vector y(n) is known to end up in a final value higher than 127 in advance, the fine search will keep track of the maximum pulse amplitude $maxamp_y$ in y achieved so far. This may also be referred to as that $maxamp_y$ is determined. This maximum pulse amplitude information is used in a pre-analysis step before entering the optimized inner dimension loop. The pre-analysis comprises determining of what precision should be used for the upcoming unit pulse addition inner-loop. As shown in FIG. 12 by the input of N, K to the PVQ-shape search, the bit allocation is known/determined before the PVQ search is initiated. The bit allocation may use formulas or stored tables for obtaining, determining and/or calculating the K to be input to the PVQ-shape search, e.g. K=function(bits(band), N) for a certain band with the dimension N and a certain number of bits(band).

| bits required for PVQ(N, K) | N = 8 | N = 16 | N = 32 |
|---|---|---|---|
| K = 4 | 11.4594 | 15.4263 | 19.4179 |
| K = 5 | 13.2021 | 18.1210 | 23.1001 |
| K = 6 | 14.7211 | 20.5637 | 26.5222 |
| K = 7 | 16.0631 | 22.7972 | 29.7253 |

For example, a stored table as the one shown above may be used to determine or select a value of K. If the dimension N is 8 and the available bits for the band bits(band) is 14.0, then K will be selected to be 5, as PVQ(N=8,K=6) requires 14.7211 bits which is higher than the number of available bits 14.0.

If the pre-analysis indicates that more than a signed 16 bit word is needed to represent the in-loop energy without losing any energy information, a higher precision and computationally more intensive high precision unit pulse addition loop is employed, where both the saved best squared correlation term and the saved best accumulated energy term are represented by 32 bit words.

$$en_{margin}=31-\lceil \log 2((1+energy_y(pulse_{tot})+2\cdot(1\cdot maxamp_y)))\rceil \quad \text{(Eq22)}$$

$$highprecision_{active}=FALSE, if(en_{margin}\geq 16)$$

$$highprecision_{active}=TRUE, if(en_{margin}<16) \quad \text{(Eq23)}$$

The worst case pre-inner loop dynamic analysis can be performed in 5-6 additional cycles in most DSP's, and the analysis cost is the same for all dimensions. In an ITU-T G.191 STS 2009 virtual 16/32 bit DSP the operations in Eq.22 and Eq 23 becomes:

```
"L_energy_y    = L_add(L_energy_y, 1); /* 0.5 added */
en_margin      = norm_l(L_mac(L_energy_y, 1, maxamp_y));
highprecision_active= 1;                    move16( );
if(sub(16,en_margin <= 0){
  highprecision_active = 0;                 move16( );
}",
``` with a cost of maximum 6 cycles.

The corresponding code in an ANSI-C code example below is:

```
L_yy         = L_add(L_yy,1);   /* .5 added */
en_margin    = norm_l(L_mac(L_yy,1, max_amp_y));
/*find max "addition", margin,~2 ops */
en_dn_shift = sub(16, en_margin); /* calc. shift to lower word */
high_prec_active = 1;   move16( );
if( en_dn_shift <= 0 ){ /* only use 32 bit energy if actually needed */
high_prec_active = 0;   move16( );
}
```

Alternatively the energy margin en_margin in Eq(22) could in line with an operation of the G.191 STL function norm_l( ) be calculated using the floor function as:

$$en_{margin} = 30 - \lfloor \log 2((1+energy_y(pulse_{tot})+2 \cdot (1 \cdot maxamp_y))) \rfloor$$

If highprecision$_{active}$ is FALSE, i.e. =0, the lower precision inner search loop in Eq 20, Eq 6 and Eq21 is employed, on the other hand, when highprecision$_{active}$ is TRUE, i.e. =1, the location of the next unit pulse is performed employing a higher precision inner loop, representing enloop$_y$ and corr$_{xy}^2$ with 32 bit words in this example. That is, when highprecision$_{active}$ is TRUE, the location of the next unit pulse in y(n) is determined by iterating over the n=0, . . . , N−1 possible positions, using equations Eq 24, Eq 6 and Eq 25.

$$corr_{xy32}(k,n)^2 = ((corr_{xy}(pulse_{tot})+2 \cdot (1 \cdot xabs(n))) \cdot 2^{corr_{upshift}})^2 \quad \text{(Eq 24)}$$

$$\left. \begin{array}{l} n_{best} = n \\ bestCorrSq_{32} = corr_{xy32}(k, n)^2 \\ bestEn_{32} = enloop_y(k, n) \end{array} \right\} \quad \text{(Eq 25)}$$

if $corr_{xy32}(k, n)^2 \cdot bestEn_{32} > bestCorrSq_{32} \cdot enloop_y(k, n)$ In other words, en_margin is indicative of how many upshifts that can be used to normalize the energy in the next loop. If 16 or more upshifts can be used, then the energy stays in the lower word length, assuming 16/32 bit word lengths, and there is no need for the high precision (32 bit representation) loop, so highprecision$_{active}$ is set to FALSE. One implementation reason for doing it in this way (allowing the energy information to stay in the low part of the L_energy 32 bit word) is that it is computationally cheaper: it costs only 1 cycle to compute extract_l (L_energy) whereas an alternative round_fx(L_shl(L_energy,en_margin)) takes two cycles.

When the best position n$_{best}$ of the unit pulse has been determined, the accumulated correlation corr$_{xy}$(k), the accumulated inloop energy enloop$_y$(k) and the number of accumulated unit pulses pulse$_{tot}$ are updated. Further, the maximum amplitude maxamp$_y$ in the best integer vector y so far, is kept up to date, i.e. determined, for the next unit pulse addition loop.

$$maxamp_y = \max(maxamp_y, y[n_{best}]) \quad \text{(Eq 26)}$$

If there are further unit pulses to add, i.e. when pulse$_{tot}$<K, a new inner-loop is started with a new near optimal corr$_{upshift}$ analysis Eq.19 and a new energy precision analysis Eq 22 and Eq 23, and then commencing the next unit pulse loop with equations Eq.24, Eq.6 and Eq. 26.

The high precision approach (in this example 32 bit words) worst case complexity for each unit pulse added to y(n) is roughly 7/N+31 cycles per quantized coefficent.

The effect of the in-loop accumulated energy based inner loop precision selection is that target sub vectors that have a high peakiness, or have very fine granularity, i.e. the final K is high, will be using the higher precision loop and more cycles more often, while non-peaky or low pulse granularity sub vectors will more often use the lower precision loop and fewer cycles.

It should be noted that the analysis described in the above section could be performed also when K<t$_p$. However, an embodiment may be made more efficient by the introduction of a threshold t$_p$ for applying the above analysis.

PVQ Vector Finalization and Normalization

After shape search, each non-zero PVQ-vector element is assigned its proper sign and the vector is L2-normalized (a.k.a. Euclidean normalization) to unit energy. Additionally, if the band was split, it is further scaled with a sub vector gain.

$$if(y(n)>0) \cap (x(n)<0) \Rightarrow y(n) = -y(n), \text{for } n=0, \ldots, N-1 \quad \text{(Eq 27)}$$

$$norm_{gain} = \frac{1}{\sqrt{y^T y}} \quad \text{(Eq 28)}$$

$$x_q(n) = norm_{gain} \cdot y(n), \text{for } n=0, \ldots, N-1 \quad \text{(Eq 29)}$$

Above, two precision methodologies were presented and specified:

"En16×CorrSq16", as defined in section above, (equations 19 thorough 21) and

"En32×CorrSq32", (equations 22 through 26). Two further medium complexity methods where the precision of the numerator Correlation Squared term and the Energy term are varied are described below.

"En16×CorrSq32" and "En32×CorrSq16" methods

The "En16×CorrSq32" method is similar to the "En32× CorrSq32", but with the difference that the inner loop best found unit pulse update and comparison uses a 16 bit representation of the best Energy bestEn$_{16}$ so far, according to:

$$\left. \begin{array}{l} n_{best} = n \\ bestCorrSq_{32} = corr_{xy32}(k, n)^2 \\ bestEn_{16} = enloop_y(k, n) \end{array} \right\} \quad \text{(Eq 30)}$$

if $corr_{xy32}(k, n)^2 \cdot bestEn_{16} > bestCorrSq_{32} \cdot enloop_y(k, n)$ The approximate cost of the "En16×CorrSq32" method per unit pulse is 5/N+21 cycles.

The "En32×CorrSq16" method is similar to the "En32× CorrSq32", but with the difference that the inner loop best found unit pulse update and comparison uses a 16 bit representation of the best squared correlation $bestCorrSq_{16}$ so far, according to:

$$\left.\begin{array}{l} n_{best} = n \\ bestCorrSq_{16} = \text{corr}_{xy16}(k, n)^2 \\ bestEn_{32} = enloop_y(k, n) \end{array}\right\}, \quad \text{(Eq 31)}$$

if $\text{corr}_{xy16}(k, n)^2 \cdot bestEn32 > bestCorrSq16 \cdot enloop_y(k, n)$ The approximate cost of the "En32×CorrSq16" method per unit pulse addition is 6/N+20 cycles per coefficient.

Aspects and Exemplifying Embodiments

Below, some exemplifying embodiments of the solution disclosed herein will be described with reference to FIGS. 1-4.

FIG. 1 is a flow chart illustrating a method concerning the fine search of PVQ shape search. The method is intended to be performed by an encoder, such as a media encoder for audio and/or video signals. The PVQ takes a target shape vector x as input, and derives a vector y by iteratively adding unit pulses in an inner dimension search loop. The method relates to a pre-analysis, which is done before entering the inner loop. An output vector $x_q$ will then be derived based on the vector y, as previously described. However, the forming of $x_q$ is not central to the solution described herein, and will therefore not be further described here.

In the method illustrated in FIG. 1, it may be assumed that the encoder keeps track of a value $maxamp_y$ of a current vector y. By "current vector y" is here meant the vector y composed, found or constructed so far, i.e. for a k<K. As previously described, a starting point for the vector y may be a projection to a surface below the $K^{th}$ pyramid, or an empty all-zero vector. The method illustrated in FIG. 1 comprises, before entering a next inner dimension search loop for unit pulse addition, determining 101, based on the maximum pulse amplitude, $maxamp_y$, of a current vector y, whether more than a current bit word length is needed to represent $enloop_y$, in a lossless manner in the upcoming inner dimension loop. The variable $enloop_y$ is related to an accumulated energy of the vector y. The performing of this method enables the encoder to keep the complexity of the search at a reasonable level. For example, it enables the encoder to apply an increased precision (implying higher complexity) loop only when it may be needed, by analyzing whether the "worst case scenario" in the upcoming inner loop would require an inner loop with a higher precision than the currently used.

The pre-analysis described above is performed before each entry 102 to the inner loop, i.e. before each addition of a unit pulse to the vector y. In an exemplifying embodiment where only two different bit representations, i.e. bit word lengths such as 16 and 32 bits, are available, the inner loop will be performed using a 16 bit representation of $enloop_y$ until it is determined that a longer bit word is needed to represent $enloop_y$, after which the higher bit word length, i.e. the 32 bit representation will be applied for the inner loop calculations. The loop using a 16 bit representation may be referred to as a "low precision loop", and the loop using a 32 bit representation may be referred to as a "high precision loop".

The determining 102 of whether more than an initial or current bit word length is needed could alternatively be expressed as that it is determined which bit word length, out of at least two different, alternative, bit word lengths, that will be required for representing the "worst case" (largest possible increase) $enloop_y$ during the next inner loop. The at least two different word bit lengths could comprise at least e.g. 16 and 32 bit word lengths.

Figure 4:
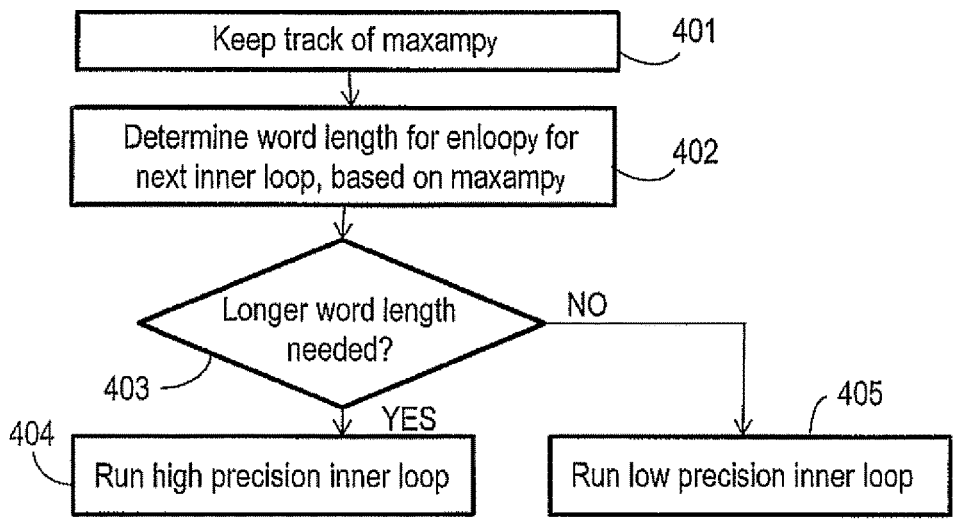

In other words, when more than a current bit word length is determined 102 to be needed to represent $enloop_y$ in the next inner loop, the inner loop calculations are performed 103 with a longer bit word length, than an initial or current bit word length, for representing $enloop_y$ in the inner loop. On the other hand, when more than a current bit word length is determined not to be needed to represent $enloop_y$, the inner loop calculations may be performed by employing a first unit pulse addition loop using a first or current bit word length to represent $enloop_y$, i.e the current bit word length may continue to be used. This is also illustrated e.g. in FIG. 4, as the use of two different loops. FIG. 4 shows one, low precision inner loop, which is run 405 when it is determined 403 that it is sufficient with a current (lower) bit word length; and one high precision inner loop, which is run when it is determined 403 that a higher bit word length is needed to represent the energy in the inner loop, in order not to lose information.

The method builds on the realization that the maximum possible increase of an energy variable, such as $enloop_y$, in a next inner loop will occur when the unit pulse is added to the position in y associated with the current $maxamp_y$. Having realized this, it is possible to determine, before entering the inner loop, whether there is a risk for exceeding the representation capacity of the currently used bit word length, e.g. 16 bits, during the next inner loop, or not. In other words, the determining of whether more than a current bit word length is needed to represent $enloop_y$ comprises determining characteristics of the case when, in the upcoming inner search loop, the unit pulse is added to the position in y being associated with $maxamp_y$. For example, the number of bits needed to represent $enloop_y$ in the upcoming inner loop may be determined, or, alternatively, a remaining margin in a bit word representing $enloop_y$ in the upcoming inner loop.

For target shape vectors being associated with a low K, it is possible to say in advance that there will be no need for a longer bit word length than the one offered by the initial and currently used bit word length. Therefore, it would be possible to apply a threshold value Tk, such that certain operations are performed only for target shape vectors being associated with a K which exceeds the threshold value Tk. For such target vectors, the encoder will keep track of $maxamp_y$, by updating this value after each pulse addition. For target vectors associated with a K which is lower than the threshold value, it is not necessary to keep track of $maxamp_y$. For the example with 16 and 32 bit words, a possible Tk would be 127, as previously described. In other words, the keeping track of $maxamp_y$ and the determining of whether more than a current bit word length is needed is performed, e.g., only when a final value of K associated with the input target shape vector exceeds a threshold value Tk.

An embodiment illustrated in FIG. 2 comprises keeping track of or determining 201 $maxamp_y$, and determining 202 $xabs_{max}$. The value of $maxamp_y$ may be changed when adding a new unit pulse in the inner loop and therefore $maxamp_y$ needs to be updated, in order to be kept up to date after each loop. For example, the action 201 may comprise keeping track of $maxamp_y$ until a value of k has reached a threshold value where the initial or current bit word length used for representing enloopy may no longer be sufficient, and the analysis represented e.g. by action 204 is commenced. The updating of $maxamp_y$ after an inner loop following the analysis of e.g. action 204 is illustrated as action 206 in FIG. 2. It should be noted, however, that $xabs_{max}$ is not changed in the process, and therefore only needs to be determined 202 once. As illustrated in FIG. 2, an embodiment of the method could also comprise, before entering 205 a next inner dimension loop for unit pulse addition, determining 203, based on a maximum absolute value, $xabs_{max}$, of the input shape vector, x, a possible upshift, in a bit word, of the next loop's accumulated in-loop correlation value, $corr_{xy}$, between x and the vector y. The upshift could also be denoted an upscaling. Equation 19 above illustrates the determining of the maximum possible upshift. By performing this, it may be ensured that as many correlation information bits as possible are maintained during the inner loop evaluation, especially the most significant ones. It should be noted here that the correlation value $corr_{xy}$, in form of $corr_{xy}^2$, need not necessarily be represented in a lossless manner. The determining of the maximum upshift may be performed in a "longer" bit word, irrespective of the current bit word length used in the inner loop. That is, the maximum possible upshift may be determined for a 32 bit word even when a 16 bit word will be used in the inner loop. When a shorter bit word is to be used in the inner loop, the determined upshift will then be "rounded" to the shorter bit word, as illustrated by Eq 20. Note that the correlation value, $corr_{xy}$, always is less than or equal to one(1.0) in the applied DSP precision for the correlation value, i.e. $corr_{xy} \leq 1.0$, and therefore, the maximum upshift determined for $corr_{xy}$ is also valid for $corr_{xy}^2$.

When more than a current bit word length is determined to be needed to represent $enloop_y$, the inner loop calculations may be performed using a longer bit word length (than the current bit word length, e.g. 32 instead of 16 bits) to represent $enloop_y$.

In one embodiment, when more than a current bit word length is determined to be needed to represent $enloop_y$, the inner loop calculations are performed with a longer bit word length (than the current bit word length), representing also an accumulated in-loop correlation value, $corr_{xy}^2$, in the inner loop. This is illustrated e.g. in FIG. 3, in action 305. That is, a bit word length determined for the energy value $enloop_y$ may also be applied for $corr_{xy}^2$.

As previously mentioned, it is preferred to avoid performing the division of Eq 8 in the inner dimension search loop for unit pulse addition. Therefore, a cross-multiplication may be performed, as illustrated in Eq 10. That is, a position, $n_{best}$, in y for addition of a unit pulse, could be determined by evaluating a cross-multiplication, for each position n in y, of a correlation and energy value for the current n; and a "best so far" correlation, BestCorrSq, and a "best so far" energy value bestEn, saved from previous values of n, as:

$$corr_{xy}^2 * bestEn > BestCorrSq * enloop_y$$

where $$\left. \begin{array}{l} n_{best} = n \\ bestEn = enloop_y \\ BestCorrSq = corr_{xy}^2 \end{array} \right\} \text{when } corr_{xy}^2 * bestEn > BestCorrSq * enloop_y$$

The position $n_{best}$ could be referred to as a "best" position in y for addition of a unit pulse. It should be noted that could be used in the expressions above instead of ">". However, ">", i.e. "larger than" may be preferred when trying to keep the computational cost as low as possible, e.g. in regard of number of cycles.

The performing of the method according to any of the embodiments described above enables this cross-multiplication to be performed in an efficient manner (e.g. by not using a higher precision than actually needed).

Implementations

The methods and techniques described above may be implemented in an encoder or codec, which may be comprised in e.g. in a communication device.

Figure 11A:
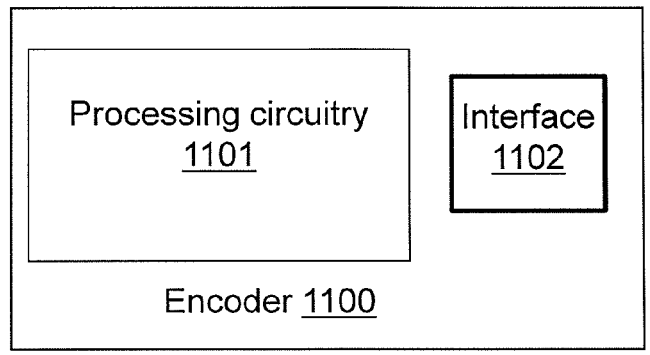
FIG. 11a-c show an encoder according to exemplifying embodiments.
Figure 11B:
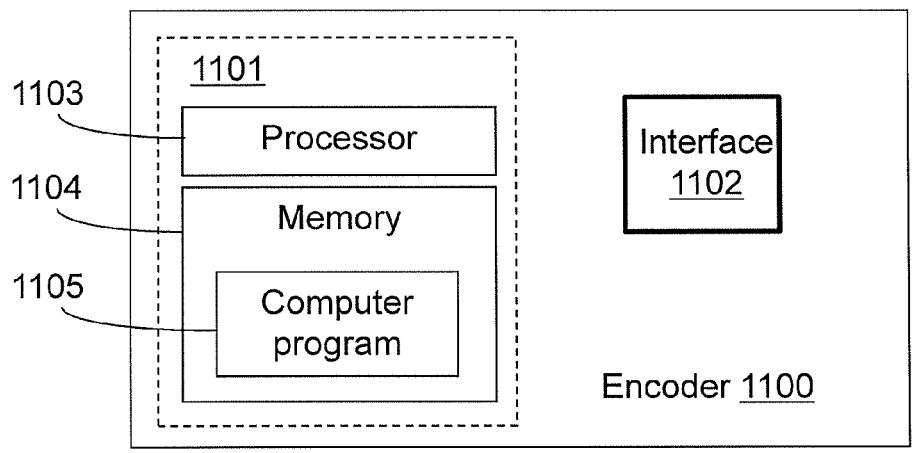
Figure 11C:
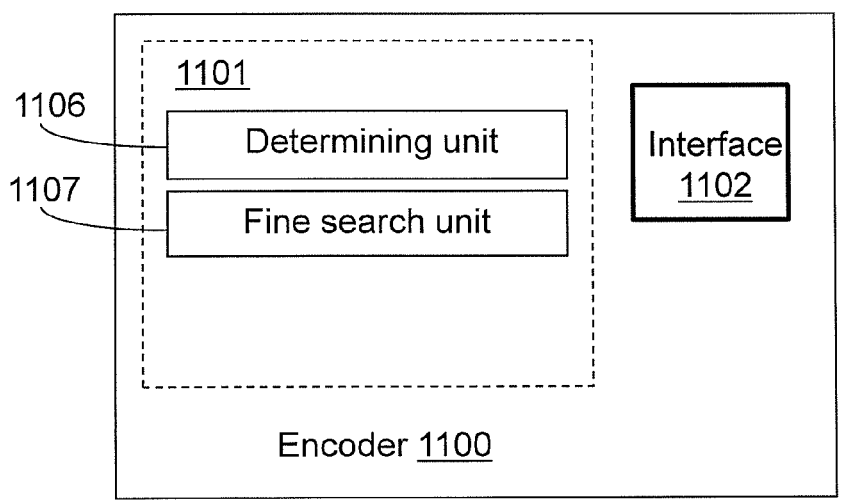

Encoder FIGS. 11a-11c

An exemplifying embodiment of an encoder is illustrated in a general manner in FIG. 11a. The encoder may be a media encoder, configured for encoding of e.g. audio and/or video signals. The encoder 1100 is configured to perform at least one of the method embodiments described above with reference to any of FIGS. 1-5. The encoder 1100 is associated with the same technical features, objects and advantages as the previously described method embodiments. In some implementations, the encoder is associated with constraints in regard memory and/or complexity, such as e.g. when the encoder is configured with a fixed precision DSP. The encoder will be described in brief in order to avoid unnecessary repetition.

The encoder may be implemented and/or described as follows:

The encoder 1100 is configured for Pyramid Vector Quantization, including so-called fine search or fine shape search, where a Pyramid Vector Quantizer, PVQ, is configured to take a target vector x as input and derives a vector y by iteratively adding unit pulses in an inner dimension search loop. The input vector x has a dimension N and an L1-norm K. The encoder 1100 comprises processing circuitry, or processing means 1101 and a communication interface 1102. The processing circuitry 1101 is configured to cause the encoder 1100 to, before entering a next inner dimension search loop for unit pulse addition: determine, based on a maximum pulse amplitude, $maxamp_y$, of a current vector y, whether more than a current bit word length is needed to represent, in a lossless manner, a variable, $enloop_y$, related to an accumulated energy of y, in the upcoming inner dimension loop. The communication interface 1102, which may also be denoted e.g. Input/Output (I/O) interface, includes an interface for sending data to and receiving data from other entities or modules.

The processing circuitry 1101 could, as illustrated in FIG. 11b, comprise processing means, such as a processor 1103, e.g. a CPU, and a memory 1104 for storing or holding instructions. The memory would then comprise instructions, e.g. in form of a computer program 1105, which when executed by the processing means 1103 causes the encoder 1100 to perform the actions described above.

An alternative implementation of the processing circuitry 1101 is shown in FIG. 11c. The processing circuitry here comprises a determining unit 1106, configured to cause the encoder 1100 to, before entering a next inner dimension search loop for unit pulse addition: determine, based on a maximum pulse amplitude, $maxamp_y$, of a current vector y, whether a higher precision than allowed with a current bit word length is needed to represent, in a lossless manner, a variable, $enloop_y$, related to an accumulated energy of y, in the upcoming inner dimension loop. The processing circuitry 1101 could comprise more units, such as a fine search unit 1107, configured to cause the encoder to run an inner dimension loop with a certain bit word length and/or a certain precision.

The encoders described above could be configured for the different method embodiments described herein, such as e.g. to perform the inner loop calculations using a longer bit word representing enloop$_y$ and possibly corr$_{xy}^2$, when more than a current bit word length is determined to be needed to represent enloop$_y$. "Longer", here refers to longer than a current or initial bit word length.

The encoder 1100 may be assumed to comprise further functionality, for carrying out regular encoder functions.

The encoder described above may be comprised in a device, such as a communication device. The communication device may be a user equipment (UE) in the form of a mobile phone, video camera, sound recorder, tablet, desktop, laptop, TV set-top box or home server/home gateway/home access point/home router. The communication device may in some embodiments be a communications network device adapted for coding and/or transcoding. Examples of such communications network devices are servers, such as media servers, application servers, routers, gateways and radio base stations. The communication device may also be adapted to be positioned in, i.e. being embedded in, a vessel, such as a ship, flying drone, airplane and a road vehicle, such as a car, bus or lorry. Such an embedded device would typically belong to a vehicle telematics unit or vehicle infotainment system.

The steps, functions, procedures, modules, units and/or blocks described herein may be implemented in hardware using any conventional technology, such as discrete circuit or integrated circuit technology, including both general-purpose electronic circuitry and application-specific circuitry.

Particular examples include one or more suitably configured digital signal processors and other known electronic circuits, e.g. discrete logic gates interconnected to perform a specialized function, or Application Specific Integrated Circuits (ASICs).

Alternatively, at least some of the steps, functions, procedures, modules, units and/or blocks described above may be implemented in software such as a computer program for execution by suitable processing circuitry including one or more processing units. The software could be carried by a carrier, such as an electronic signal, an optical signal, a radio signal, or a computer readable storage medium before and/or during the use of the computer program in the communication device.

The flow diagram or diagrams presented herein may be regarded as a computer flow diagram or diagrams, when performed by one or more processors. A corresponding apparatus may be defined by a group of function modules, where each step performed by the processor corresponds to a function module. In this case, the function modules are implemented as a computer program running on the processor. It is to be understood that the function modules do not have to correspond to actual software modules.

Examples of processing circuitry includes, but is not limited to, one or more microprocessors, one or more Digital Signal Processors, DSPs, one or more Central Processing Units, CPUs, and/or any suitable programmable logic circuitry such as one or more Field Programmable Gate Arrays, FPGAs, or one or more Programmable Logic Controllers, PLCs. That is, the units or modules in the arrangements in the different devices described above could be implemented by a combination of analog and digital circuits, and/or one or more processors configured with software and/or firmware, e.g. stored in a memory. One or more of these processors, as well as the other digital hardware, may be included in a single application-specific integrated circuitry, ASIC, or several processors and various digital hardware may be distributed among several separate components, whether individually packaged or assembled into a system-on-a-chip, SoC.

It should also be understood that it may be possible to re-use the general processing capabilities of any conventional device or unit in which the proposed technology is implemented. It may also be possible to re-use existing software, e.g. by reprogramming of the existing software or by adding new software components.

Further Exemplifying Embodiments

Expressed in a slightly different manner, the disclosure herein relates to, for example, the following aspects and embodiments.

Figure 5:
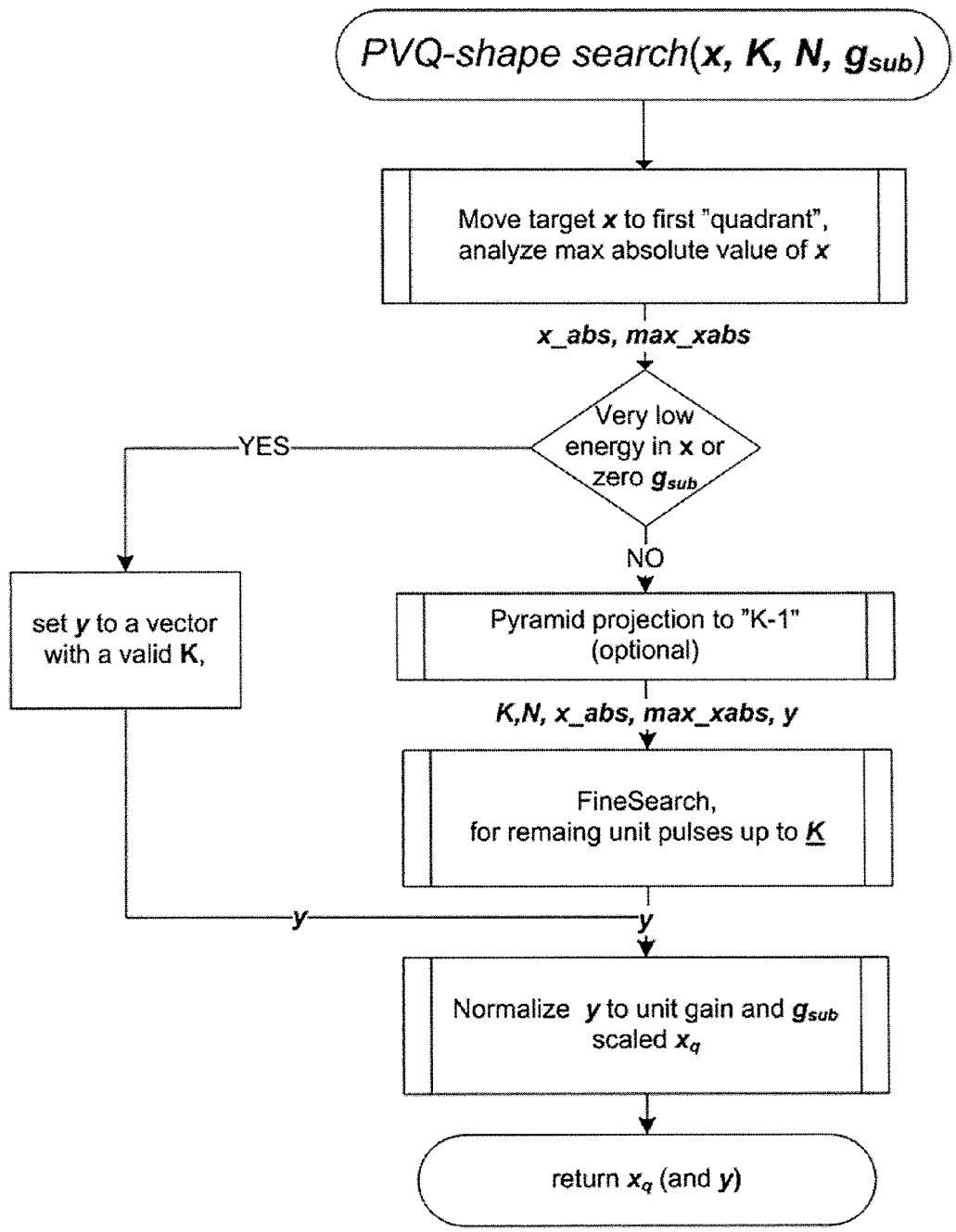
FIG. 5 shows steps of an embodiment of a PVQ shape search (fine search), according to an exemplifying embodiment.
Figure 6:
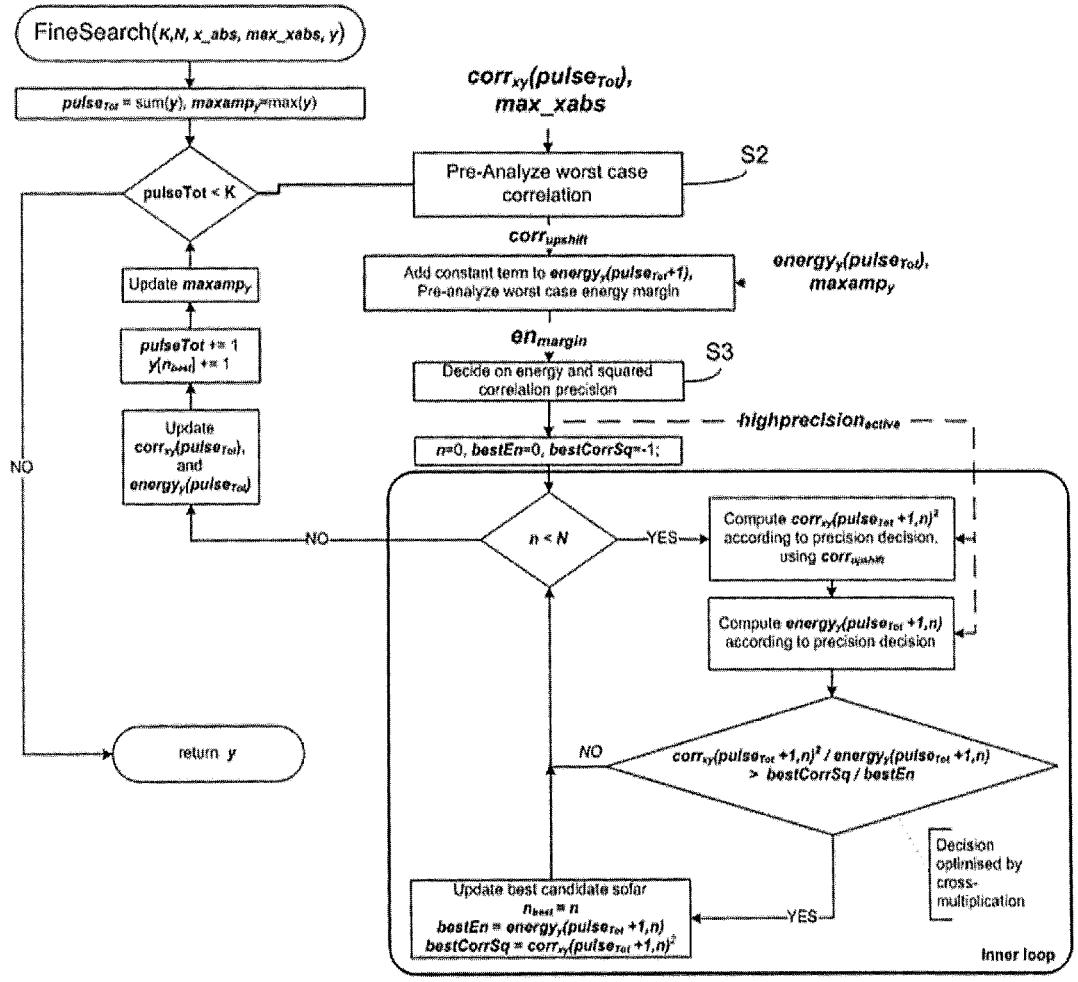
FIG. 6 shows steps of the PVQ shape search (fine search) of FIG. 5 in more detail, according to an exemplifying embodiment.

One of the aspects is an encoder/codec, wherein the encoder/codec is configured to perform one, more than one or even all of the following steps, illustrated e.g. in FIGS. 5-6:

determining, calculating or obtaining a maximum absolute value (xabs$_{max}$) of an input target vector (x(n)), e.g. according to equations 11 and 12 above and as illustrated e.g. with step S1 in FIG. 5 in one embodiment, determining, calculating or obtaining a possible upshift of a correlation value based at least on the maximum absolute value (xabs$_{max}$), e.g. by calculating the possible upshift of a next loop's accumulated in-loop correlation value in a signed 32-bit word through the equation 19 below and illustrated with step S2 in FIG. 5 in one embodiment, if the number of final unit pulses (K) will end up higher than a threshold (t$_p$), which for example may be 127 unit pulses, determine, e.g. keep track of/store, a maximum pulse amplitude (maxamp$_y$) value/information calculated e.g. according to equation 26 above of a vector (y(n)), which may be defined according to equations 13 and 14 above, and determining/calculating/deciding/selecting based on the stored maximum pulse amplitude, e.g. through a calculation in accordance with equations 22 and 23 below and as illustrated by step S3 in FIG. 6, if more than a certain word length is needed or should be used, e.g. more than a signed 16 bit word or more than a signed 32 bit word, to represent in-loop energy without losing, or substantially losing, any energy information, representing a best squared correlation term/parameter/value and a best accumulated energy term/parameter/value by more than the certain word length, e.g. 32 bit words or 64 bit words, if more than the certain word length is needed, and if less than the certain word length is needed, running a first loop, if more than the certain word length is needed, running a second, alternative loop with the "best so far" (near optimal) accumulated energy term and best squared correlation term represented by the more than the certain word length words.

The second loop may be a higher precision and computationally more intensive high precision unit pulse loop than the lower precision (i.e. in relation to the second loop) first loop. The inloop accumulated energy based selection of the inner loop precision has the effect that target sub vectors that have a high peakiness, or have very fine granularity (final K is high) will or could be using the higher precision loop and more cycles more often, while non-peaky or low pulse granularity sub vectors will or could more often use the lower precision loop and fewer cycles.

Figure 9:
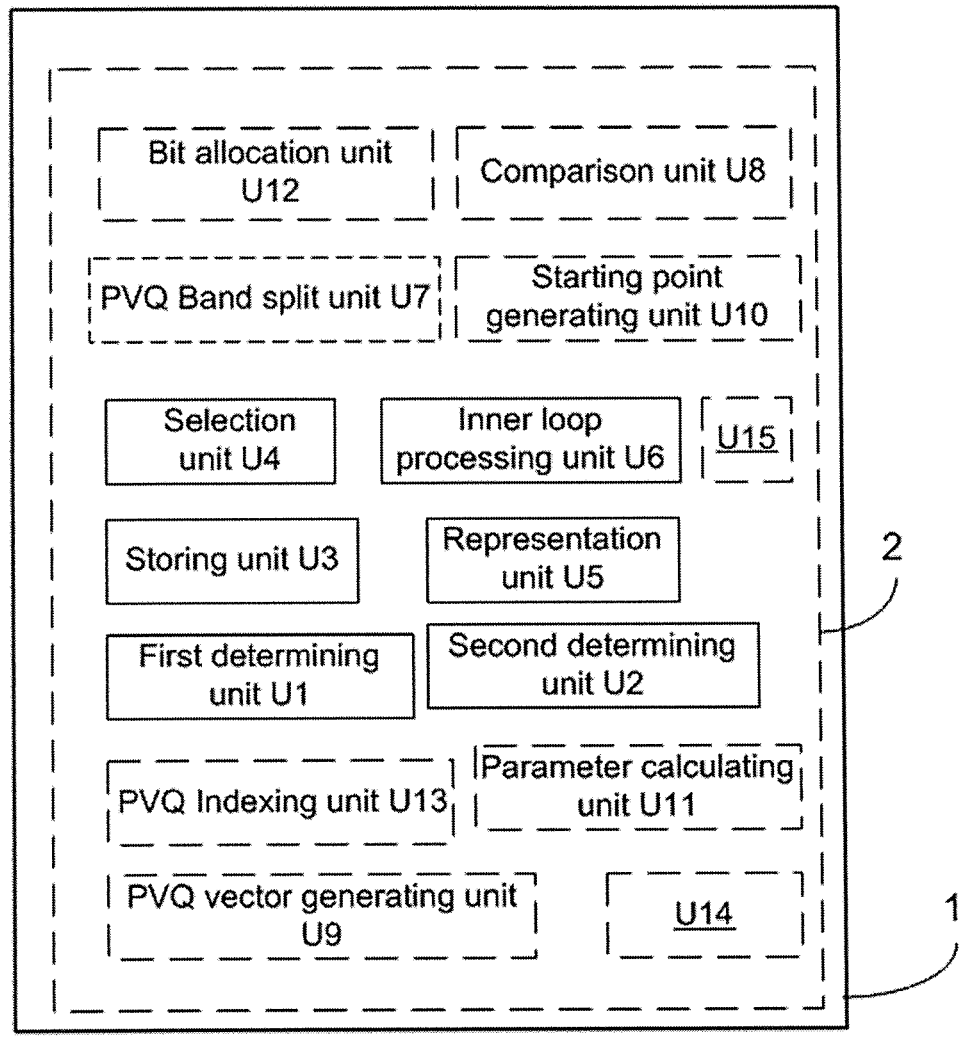
FIG. 9 shows an embodiment of a communication device.

One aspect relates to a communication device 1, illustrated in FIG. 9, which comprises an encoder or codec 2 for video or audio coding, e.g. an EVS encoder.

The encoder or codec may be fully or partially implemented as a DSP positioned in the communication device. In one first embodiment the encoder/codec is configured to make a PVQ-shape search based on a target sub vector (x(n)), the number of finite unit pulses (K), a sub vector dimension value (N) of the target sub vector and optionally also one or more gain values ($g_{sub}$). The encoder or codec may also be configured to make a PVQ band split, and in such a case the PVQ-shape search would also be based on a number/value of sub vectors of a band (Ns) and a largest gain of a gain vector G, ($g_{max}$=max (G)=max ($g_o$ ... g(Ns−1))). The encoder or codec is further configured to output from the PVQ-shape search an integer vector (y) and/or a shape sub vector $x_q(n)$ to be used by the encoder for PVQ indexing. The integer vector (y) comprises element values and has the same length as the sub vector dimension value (N) and an absolute sum of all the element values is equal to the number of unit pulses (K).

The encoder/codec/communication device is configured to perform the PVQ-shape search, wherein the encoder/codec/communication device is configured to:

determine, calculate or obtain (S1, S23) a maximum absolute value ($xabs_{max}$) of the input (target) vector (x(n)), e.g. according to equations 11 and 12 above, determine, calculate or obtain (S2,S28) a possible upshift of a correlation value based at least on the maximum absolute value ($xabs_{max}$), e.g. by calculating the possible upshift of a next loop's accumulated in-loop correlation value in a signed 32-bit word through the equation 19 above, if the number of final unit pulses (K) will end up higher than a threshold ($t_p$), which for example may be 127 unit pulses, keep track of/store (S30) a maximum pulse amplitude ($maxamp_y$) value/information calculated e.g. according to equation 26 above of a vector (y(n)), which may be defined according to equations 13 and 14 above, and determine/calculate/decide/select (S3, S32) based on the stored maximum pulse amplitude, e.g. through a calculation in accordance with equations 22 and 23 above, if more than a certain word length is needed or should be used, e.g. more than a signed 16 bit word or more than a signed 32 bit word, to represent in-loop energy, represent (S34) a best squared correlation term/parameter/value and a best accumulated energy term/parameter/value by more than the certain word length, e.g. 32 bit words or 64 bit words, if more than the certain word length is needed, and if less than the certain word length is determined, run (S33) a first loop, if more than the certain word length is determined, run (S35) a second, alternative loop with the best accumulated energy term and best squared correlation term represented by the more than the certain word length words.

The above PVQ-shape search, which may be a limited precision PVQ-shape search, is in one embodiment performed by a vector quantizer, which is a part of the encoder/codec and may be implemented at least partly, but also fully as a DSP unit, which may be positioned in or adapted to be positioned in a communication device. Thus the encoder/codec may be fully or partly implemented as a hardware unit, e.g. a DSP or a programmable-field gate array (FPGA).

It may however in alternative embodiments be implemented with the help of a general purpose processor and a codec computer program which when run on the general purpose processor causes the communication device to perform one or more of the steps mentioned in the paragraph above. The processor may also be a Reduced Instruction Set Computing (RISC) processor.

Figure 10:
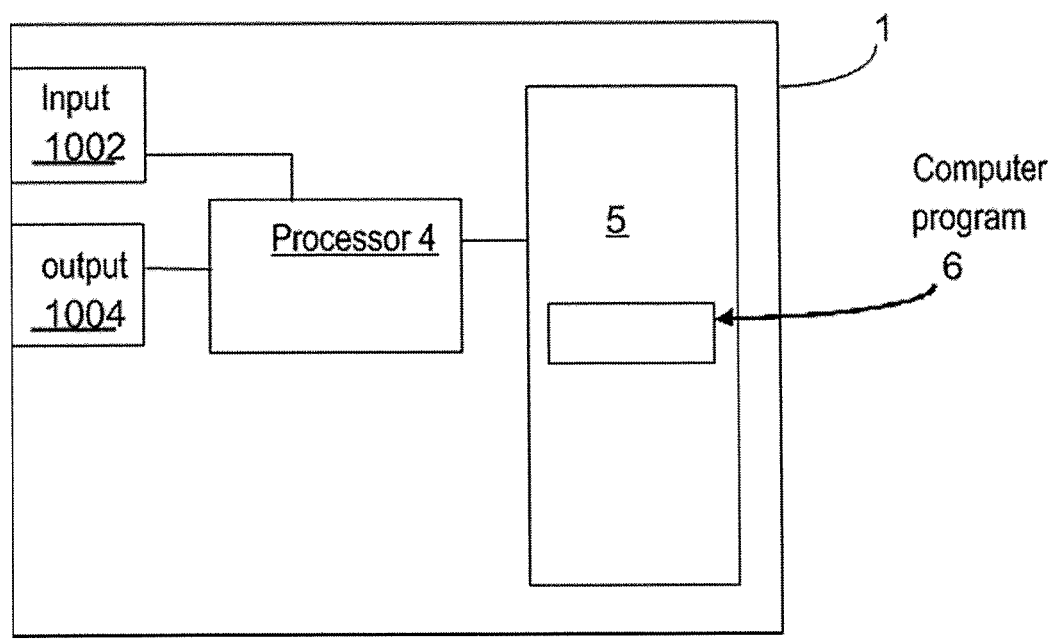
FIG. 10 also shows an embodiment of a communication device.

Another aspect of the disclosure herein is, as indicated in the paragraph above, a computer program 6 illustrated in FIG. 10 and where one embodiment is fully disclosed by the ANSI-C code example in appendix 1 below, such as an encoder computer program or codec computer program, comprising computer readable code, which when run on a processor/processor unit 4 of a communication device 1 causes the communication device to perform one or more of the steps mentioned in conjunction with the method in the paragraph below or any of the steps mentioned in conjunction with FIG. 7.

Yet another aspect is a PVQ-shape search method performed by a communication device/codec/encoder, wherein the method comprises one or more of the following steps:

determining, calculating or obtaining (S1) a maximum absolute value ($xabs_{max}$) of the input (target) vector (x(n)), e.g. according to equations 11 and 12 above, determining, calculating or obtaining (S2, S28) a possible upshift of a correlation value based at least on the maximum absolute value ($xabs_{max}$), e.g. by calculating the possible upshift of a next loop's accumulated in-loop correlation value in a signed 32-bit word through the equation 19 above, if the number of final unit pulses (K) will end up higher than a threshold ($t_p$), which for example may be 127 unit pulses, keep track of/store a maximum pulse amplitude ($maxamp_y$) value/information calculated e.g. according to equation 26 above of a vector (y(n)), which may be defined according to equations 13 and 14 above, and a determining/calculating/deciding/selecting (S3) based on the stored maximum pulse amplitude, e.g. through a calculation in accordance with equations 22 and 23 above, if more than a certain word length is needed or should be used, e.g. more than a signed 16 bit word or more than a signed 32 bit word, to represent in-loop energy, representing a best squared correlation term/parameter/value and a best accumulated energy term/parameter/value by more than the certain word length, e.g. 32 bit words or 64 bit words, if more than the certain word length is needed, and if less than the certain word length is determined, running a first loop, if more than the certain word length is determined, running a second, alternative loop with the best accumulated energy term and best squared correlation term represented by the more than the certain word length words.

The communication device may be a user equipment (UE) in the form of a mobile phone, video camera, sound recorder, tablet, desktop, laptop, TV set-top box or home server/home gateway/home access point/home router, etc. as defined above.

Still another aspect is a computer readable storage medium 5 (see FIG. 10) on which any of the above embodiments of the computer program is stored. The computer readable storage medium may be in the form of a volatile or non-volatile memory, e.g. an EEPROM (Electrically Erasable PROM), FPGA, a flash memory (including Solid-state drive), and a hard drive.

An embodiment of the communication device 1 is illustrated in FIG. 9. The communication device comprises, for the performance of a PVQ-shape search, one, more than one or all of the following units:

a first determining unit, U1, for determining, calculating or obtaining a maximum absolute value ($xabs_{max}$) of the input (target) vector ($x(n)$), e.g. according to equations 11 and 12 above, a second determining unit, U2, for determining, calculating or obtaining a possible upshift of a correlation value based at least on the maximum absolute value ($xabs_{max}$), e.g. by calculating the possible upshift of a next loop's accumulated in-loop correlation value in a signed 32-bit word through the equation 19 above, a storing unit, U3, for keeping track of/store a maximum pulse amplitude ($maxamp_y$) value/information calculated e.g. according to equation 26 above of a vector ($y(n)$), which may be defined according to equations 13 and 14 above, if the number of final unit pulses (K) will end up higher than a threshold ($t_p$), a selection unit, U4 for determining/calculating/deciding/selecting based on the stored maximum pulse amplitude, e.g. through a calculation in accordance with equations 22 and 23 above, if more than a certain word length is needed or should be used, e.g. more than a signed 16 bit word or more than a signed 32 bit word, to represent in-loop energy, a representation unit, U5, for generating a best squared correlation term/parameter/value and a best accumulated energy term/parameter/value with a word length, e.g. 32 bit words or 64 bit words, being more than the certain word length if more than the certain word length is selected by the selection unit, and an inner loop processing unit, U6, for
running a first loop, if less than the certain word length is selected by the selection unit, and
running a second, alternative loop with the best accumulated energy term and best squared correlation term represented by the more than the certain word length words, if more than the certain word length is determined.

The units mentioned in the paragraph above may be comprised in a codec/encoder 2 in the form of a DSP in the communication unit and may furthermore be comprised in a hardware vector quantizer of the DSP. In an alternative embodiment, all the units in the paragraph above are implemented in the communication device as software.

As further illustrated in FIG. 9, the communication device 1 may also comprise further units related to the encoder/codec and in particular units related to vector quantization and PVQ-shape searching. Such units are configured to enable shape searches according to the description and figs comprised in this application. Exemplary units illustrated in FIG. 9 are:

a PVQ band split unit U7 for performing the optional step S21 described in conjunction with FIG. 7, a comparison unit U8 for performing the step S24 described in conjunction with FIG. 7 below, a PVQ vector generating unit U9 for performing the step S25 described below, a starting point generating unit U10 for performing the step S26 described below, a parameter calculating unit U11 for performing the step S27 described below, a bit allocation unit U12 for e.g. supplying K and N to the shape search, and a PVQ indexing unit U13, which can be seen as a receiver of the output from the PVQ-shape search disclosed herein, a normalization unit U14 for performing step S36 described below, and an output unit U15 for performing step S37 described below.

In the case of a software implementation in a communication device, an embodiment of the communication device 1 may be defined as a communication device comprising a processor 4 and a computer program storage product 5 in the form of a memory, said memory containing instructions executable by said processor, whereby said communication device is operative to perform one, more than one or all of the following:

determine, calculate or obtain a maximum absolute value ($xabs_{max}$) of an input (target) vector ($x(n)$), e.g. according to equations 11 and 12 above, determine, calculate or obtain a possible upshift of a correlation value based at least on the maximum absolute value ($xabs_{max}$), e.g. by calculating the possible upshift of a next loop's accumulated in-loop correlation value in a signed 32-bit word through the equation 19 above, if the number of final unit pulses (K) will end up higher than a threshold ($t_p$), which for example may be 127 unit pulses, keep track of/store a maximum pulse amplitude ($maxamp_y$) value/information calculated e.g. according to equation 26 above of a vector ($y(n)$), which may be defined according to equations 13 and 14 above, and determine/calculate/decide/select based on the stored maximum pulse amplitude, e.g. through a calculation in accordance with equations 22 and 23 above, if more than a certain word length is needed or should be used, e.g. more than a signed 16 bit word or more than a signed 32 bit word, to represent in-loop energy, represent a best squared correlation term/parameter/value and a best accumulated energy term/parameter/value by more than the certain word length, e.g. 32 bit words or 64 bit words, if more than the certain word length is needed, and if less than the certain word length is determined, run a first loop, if more than the certain word length is determined, run a second, additional loop with the best accumulated energy term and best squared correlation term represented by the more than the certain word length words.

To further illustrate aspects and embodiments, some of them are in the following going to be described in conjunction with FIGS. 7-8.

Figure 8:
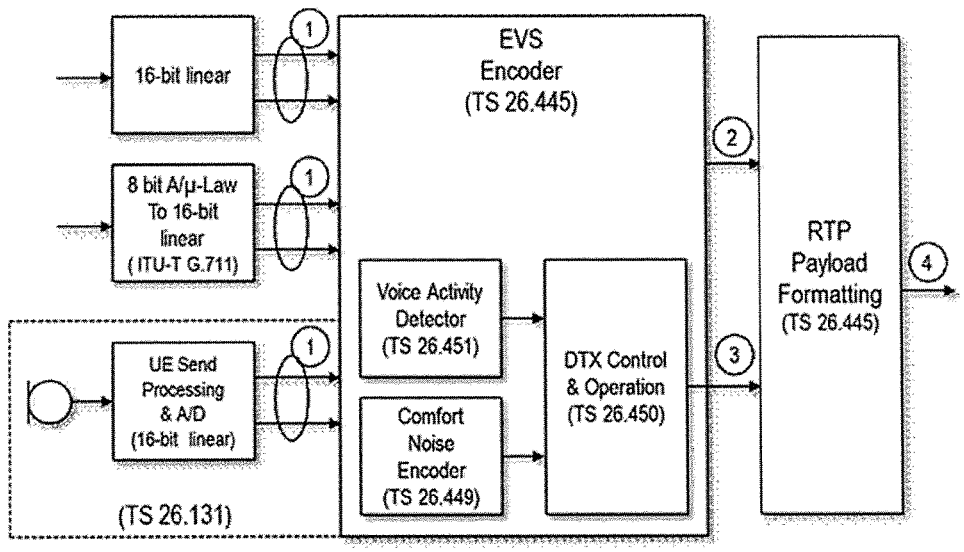
FIG. 8 shows an embodiment of a communication device equipped with an EVS encoder.

FIG. 8 provides an overview of a transmitting side of the emerging 3GPP EVS, including an EVS encoder 3, which here is comprised in the communication device 1.

Figure 7:
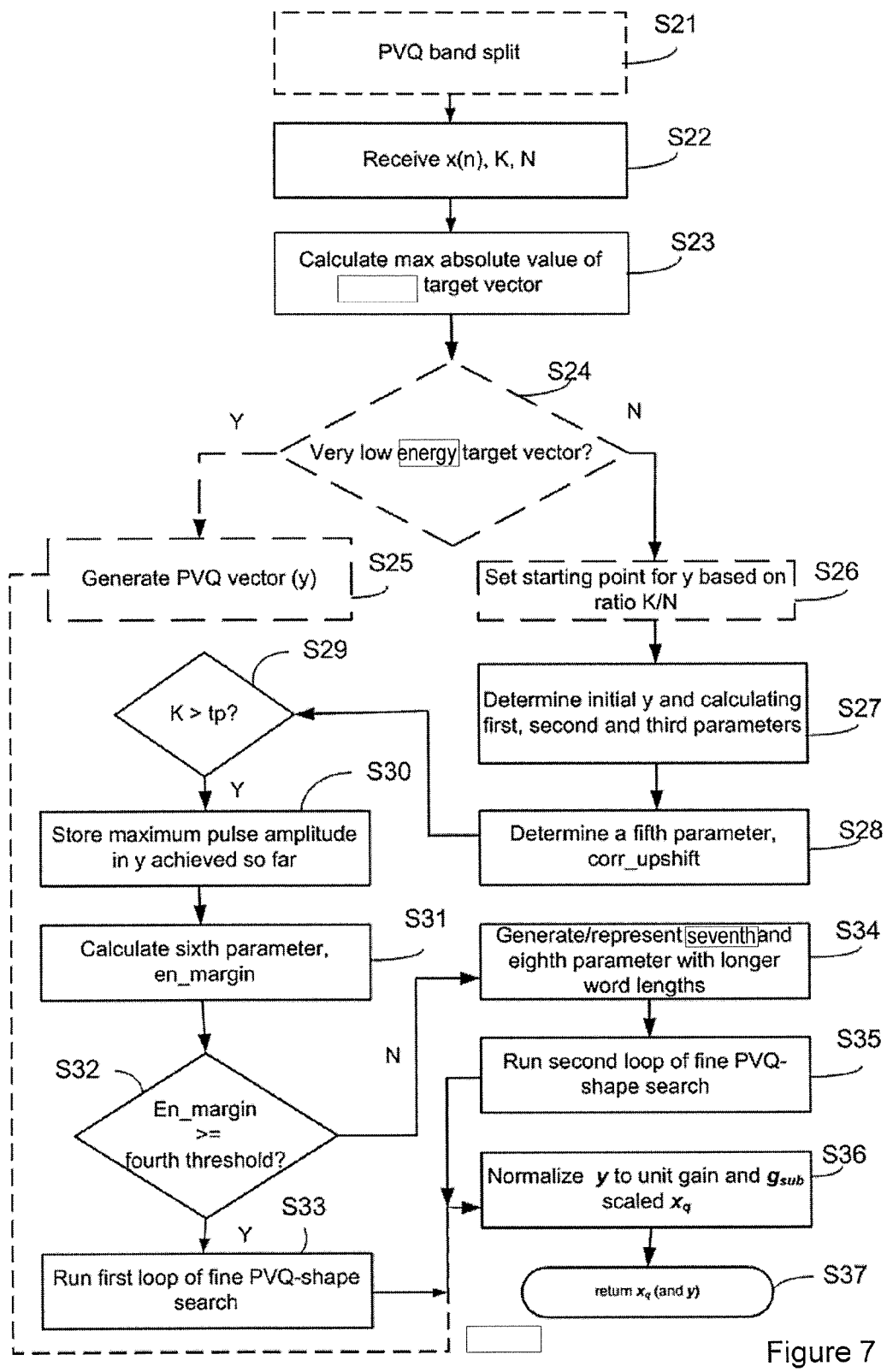
FIG. 7 illustrates embodiments of a PVQ-shape search.

FIG. 7 illustrates some method steps in an alternative way of describing some embodiments in relation to the embodiments illustrated in FIG. 5-6. Even though some of the steps mentioned with respect to FIG. 7 can be said to be made in conjunction with a PVQ-shape search, it should also be apparent that some of the steps could also be said to be performed before the PVQ-shape search. In an optional first step S21, a PVQ band split is performed.

Shape target sub vectors, optionally from step S21, are received in a second step S22, wherein, in dependence of embodiment, also $g_{sub}$, $g_{max}$ and $N_s$ may be received.

In a third step S23, which corresponds to step S1 in FIG. 5, a max absolute value of a target vector is determined, e.g. by first calculating the absolute value of the sub vector $x(n)$ of the target vector and then selecting the largest absolute value of the sub vector.

In an optional fourth step S24, it is determined whether the value of the target vector is equal to or below a first threshold. The threshold is set to "filter out" target vectors which are considered to have very low energy values. As explained above, the threshold could be set to be equal to zero in one embodiment. It could in this fourth step also be decided if a sub vector gain is equal to or below a second threshold. In one embodiment the second threshold is set to zero, but may in other embodiments be set to be the Machine Epsilon in dependence of the precision used for processed words.

If it in the fourth step S24 is determined that the target vector is equal or below the first threshold and/or the sub vector gain is below or equal to the second threshold, then a PVQ-vector is created in an optional fifth step S25. The creation is in one embodiment deterministically created by assigning half of the K unit pulses to a first position $$\left(y[0] = \left\lfloor \frac{K}{2} \right\rfloor\right),$$

and the remaining unit pulses to a last position ($y[N-1]=y[N-1]+(K-y[0])$). This step could in conjunction with the fourth step S24 be seen as bypassing the whole actual PVQ-shape search, but can also be seen as a sub-routine within the context of a general PVQ-shape search procedure.

In an optional sixth step S26, an initial value (starting point) for y, y_start, is set for the PVQ-shape search to follow, wherein the initial value is dependent on the ratio between K and N. If the ratio is larger than a third threshold value, which may be 0.5 unit pulses per coefficient, a first projection to a K-1 sub pyramid is used as the initial vector_y_start in a following step. The first projection may be calculated as in equations 13 and 14 above. if lower than the third threshold, then the initial vector y_start is decided to start off from 0 pre-placed unit pulses.

In preparation for subsequent PVQ-shape search steps, all the initial vector values in y_start is set to zero in a seventh step S27. In this step a first parameter, here called the accumulated number of unit pulses, $pulse_{tot}$, and a second parameter, here the accumulated correlation, $corr_{xy}(pulse_{tot})$, and a third parameter, here called the accumulated energy $energy_y(pulse_{tot})$ for the starting point are computed, e.g. according to equations 15-17 respectively. A fourth parameter, here called $enloop_y(pulse_{tot})$ may also be calculated in this step according to equation 18 above.

In an eighth step S28, a PVQ-shape search is started, or in an alternative way of looking at it, the second, fine search part of the PVQ-shape search is started for remaining unit pulses up to K with the help of previously obtained, determined or calculated K, N, X_abs, max_xabs, and y, and in some embodiments also $g_{sub}$, $g_{max}$ and $N_S$. Detailed steps of some embodiments of this fine search are thoroughly illustrated by e.g. FIG. 6, but it could be emphasized that in some embodiments the fine search comprises a determination of a fifth parameter/value, here called an upshift of a correlation value, $corr_{upshift}$, is calculated for at least some, and in some embodiments all, the unit pulses for which the fine search or inner loop is done. In some embodiments a possible upshift of a next loop's accumulated in-loop correlation value in a signed 32-bit word is calculated based on equation 19 above and $corr_{upshift}$ is then used as input to a calculation of a correlation value $corr_{xy}$ in equation 20.

In a ninth step S29, which may be said to be a part of the fine PVQ-shape search, it is determined whether the number of final unit pulses K will end up higher than a third threshold, $t_p$, for the number of final unit pulses. If this is the case, then in a tenth step S30, the maximum pulse amplitude $maxamp_y$ is stored.

In an eleventh step S31, a sixth parameter, $en_{margin}$, is calculated according to e.g. equation 22.

In a twelfth step S32, the sixth parameter is compared with fourth threshold value, which corresponds to a certain word length.

If the answer YES (in S32 FIG. 7) or False (in Ansi-code example in Appendix 1) is, i.e. $en_{margin}$ in the exemplary equation/decision 23 is equal or larger than fourth threshold "16", then in a step S33, a first, faster and "coarser" loop is run than in a second loop of the fine search. Embodiments of the first loop are shown in e.g. FIG. 6.

If the answer is "No" (in S32 FIG. 7) or True (in Ansi-code example in Appendix 1), i.e. $en_{margin}$ in the exemplary equation/decision 23 is less than "16", then in a fourteenth step S34, a seventh parameter, the best squared correlation term/parameter/value, and an eighth parameter, best accumulated energy term/parameter/value, are generated/transformed to become more than the certain word length, which then in a fifteenth step S35 are used in the second, more detailed inner loop of the fine search. Embodiments of the second loop are shown in more detail in e.g. FIG. 6.

In a sixteenth step S36, at least each non-zero PVQ-sub vector element is assigned its proper sign and the vector is L2-normalized to unit energy. If, in some embodiments, a band has been split, then it is scaled with a sub-vector gain $g_{sub}$. A normalized $x_q$ may also be determined based on equation 28. An exemplary procedure for this step is more thoroughly described above.

In a seventeenth step S37, the normalized $x_q$ and y are output from the PVQ-shape search process and forwarded to a PVQ-indexing process included in e.g. the codec.

Some advantages of embodiments and aspects

Below are some advantages over prior art enabled at least some of the aspects and embodiments disclosed above.

The proposed correlation scaling method/algorithm using a pre-analysis of the current accumulated maximum correlation, improves the worst case (minimum) SNR performance of a limited precision PVQ-shape quantization search implementation. The adaptive criterion for up-front correlation margin analysis requires very marginal additional complexity. Further no costly pre-normalization of the target vector x to e.g. unit energy is required.

The adaptive criterion using tracking of the maximum pulse amplitude in the preliminary result, followed by a pre-analysis of the worst case accumulated energy, for e.g. the soft 16/32 bit precision inner-loop decision requires very little additional computational complexity and provides a good trade-off where the complexity may be kept low while high precision correlation and high precision energy metrics are still used for relevant input signals, and further subjectively important peaky signals will be assigned more precision. In other words, at least some of the embodiments and aspects improve the functioning of a computer/processor itself.

In Tables 2/3 above in appendix 2 below, one can find that an example PVQ-based system using the adaptive precision logic cost will be 6.843 WMOPS, if one would use 32 bit energy and squared correlation precision in all (any K) inner search loops the cost is raised to 10.474 WMOPS.

Concluding Remarks

The embodiments described above are merely given as examples, and it should be understood that the proposed technology is not limited thereto. It will be understood by those skilled in the art that various modifications, combinations and changes may be made to the embodiments without departing from the present scope. In particular, different part solutions in the different embodiments can be combined in other configurations, where technically possible.

When using the word "comprise" or "comprising" it shall be interpreted as non-limiting, i.e. meaning "consist at least of".

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of inventive concepts.

It is to be understood that the choice of interacting units, as well as the naming of the units within this disclosure are only for exemplifying purpose, and nodes suitable to execute any of the methods described above may be configured in a plurality of alternative ways in order to be able to execute the suggested procedure actions.

It should also be noted that the units described in this disclosure are to be regarded as logical entities and not with necessity as separate physical entities.

Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed hereby. Moreover, it is not necessary for a device or method to address each and every problem sought to be solved by the technology disclosed herein, for it to be encompassed hereby.

In some instances herein, detailed descriptions of well-known devices, circuits, and methods are omitted so as not to obscure the description of the disclosed technology with unnecessary detail. All statements herein reciting principles, aspects, and embodiments of the disclosed technology, as well as specific examples thereof, are intended to encompass both structural and functional equivalents thereof. Additionally, it is intended that such equivalents include both currently known equivalents as well as equivalents developed in the future, e.g. any elements developed that perform the same function, regardless of structure.

ABBREVIATIONS

N vector dimension
$N_s$ sub-vector dimension
x target vector
$x_q$ Quantized shape vector
$y_{final}$ integer vector adhering to the L1-norm K
K Number of final unit pulses
k number of accumulated unit pulses index
n coefficient or sample index
i sub vector index
MDCT Modified Discrete Cosine Transform
PVQ Pyramid Vector Quantizer (Quantization)
WC Worst Case
WMOPS Weighted Million Operations Per Second
AccEn Accumulated Energy
ROM Read Only Memory
PROM Program ROM
SNR Signal-to-Noise Ratio
EVS Enhanced Voice Service
3GPP $3^{rd}$ Generation Partnership Project
DSP Digital Signal Processor
CELT Constrained Energy Lapped Transform
IETF Internet Engineering Task Force
MAC Multiply-Accumulate
ACELP Algebraic code-excited linear prediction
EPS Machine epsilon

APPENDIX 1

Exemplary implementation of embodiment in ANSI-C code
Below is an example of an implementation of an exemplifying embodiment in ANSI
C-code using STL 2009 G.191 virtual 16/32 bit (a simulation of a DSP).

```
static
Word16 max_val_fx(            /* o : maximum value in the input vector   */
           const Word16 *vec,  /* i : input vector                        */
           const Word16 lvec   /* i : length of input vector              */
           )
{
   Word16 j,tmp;
   tmp = vec[0];   move16( );
   FOR ( j=1 ; j<lvec ; j++ )
   {
      tmp = s_max(vec[j],tmp);
   }
   return tmp;
}
/* The inner search loop for one single additional unit pulse, starting from pulse_tot ,
   with information about required energy precision/down scaling for the dim loop in en_dn_shift,
```

APPENDIX 1-continued

Exemplary implementation of embodiment in ANSI-C code
Below is an example of an implementation of an exemplifying embodiment in ANSI
C-code using STL 2009 G.191 virtual 16/32 bit (a simulation of a DSP).

```
  and the current max_xabs absolute value to be used for an near optimal correlation upscaling.
  returns the index of the best positioned unit pulse in imax
*/
static
Word16 one_pulse_search(const Word16 dim,      /* vector dimension      */
           const Word16* x_abs,  /* absolute vector values */
           Word16* y,            /* output vector         */
           Word16 *pulse_tot_ptr,
           Word32* L_xy_ptr,     /* accumulated correlation */
           Word32* L_yy_ptr,     /* accumulated energy     */
           Word16 high_prec_active,
           Word16 en_dn_shift,
           Word16 max_xabs)      /* current accumulated max amplitude for pulses */
{
   Word16 i, corr_up_shift, corr_tmp, imax, corr_sq_tmp, en_max_den, cmax_num, en_tmp;
   Word32 L_tmp_en_lc, L_tmp_corr ;
   Word32 L_tmp_en, L_en_max_den, L_corr_sq_max, L_tmp_corr_sq;
   Word32 L_left_h, L_right_h;
   UWord32 UL_left_l, UL_right_l, UL_dummy;
#ifndef NONBE_PVQ_SEARCH_FIX
   Word16  corr_margin;
#endif
#ifdef BE_CLEAN_PVQ_SEARCH
   Word32 L_tmp;
   UWord32 UL_tmp;
   UWord16 u_sgn;
#endif
   /* maximize correlation precision, prior to every unit pulse addition in the vector */
   corr_up_shift   = norm_l(L_mac(*L_xy_ptr, 1, max_xabs));
   /* pre analyze worst case L_xy update in the dim loop        , 2 ops */
   /* clean BE code, with split out low/high precision loops              */
   /* activate low complexity en/corr search section conditionally if resulting energy is within limits */
   /* typical case for higher dimensions                          */
   IF( high_prec_active == 0 )
   {
      en_max_den    = 0; /*move16( )*/; /* OPT: move saved by using high_prec_active as
                                                    en_max_den */
      cmax_num      = -1; move16( );  /* req. to force a 1st update for n==0   */
      FOR(i = 0; i < dim; i++)  /* FOR 3 ops */
      {
         L_tmp_corr   = L_shl(L_mac(*L_xy_ptr,1,x_abs[i]), corr_up_shift ); /* actual in-loop target */
         corr_tmp     = round_fx(L_tmp_corr);
         corr_sq_tmp  = mult(corr_tmp, corr_tmp); /* CorrSq, is 16bit for low complexity crossmult */
         L_tmp_en_lc = L_mac(*L_yy_ptr, 1,y[i] );
         /*Q1 result , energy may span up to ~14+1(Q1)+1(sign)=16 bits, 1 op */
         /* extract_l without shift can always be used for this section as energy is guaranteed to stay in
            the lower word, 1 op */
         en_tmp    = extract_l(L_tmp_en_lc);
         /* L_shl + round_fx could also be used also but then adds an uphift cost (2-3 ops)*/
         /* 16/32 bit comparison    WC (4 +1+1 + (1+1+1) = 9            */
         /* corr_sq_tmp/en_tmp_den   >  cmax_num/en_max_den   */
         /* corr_sq_tmp * en_max_den >  cmax_num * en_tmp    */           /* IF    4 ops */
         IF( L_msu(L_mult(corr_sq_tmp, en_max_den),cmax_num , en_tmp) > 0)   /*     2 ops */
         {
            cmax_num   = corr_sq_tmp; move16( );   /* 1 op */
            en_max_den = en_tmp;      move16( );   /* 1 op */
            imax       = i;       move16( );   /* 1 op */
         }
      }/* dim */
   }
   ELSE
   { /* High resolution section activated when vector energy is becoming high (peaky or many pulses)
      */
      /* BASOP operator Mpy32_32_ss used to allow higher resolution for both the CorrSq & Energy
         terms */
      /*Performance:  close to float reference                          */
      L_en_max_den = L_deposit_l(0);                               /* 1 op */
      L_corr_sq_max = L_deposit_l(-1); /* req. to force a 1st update */   /* 1 op */
      FOR(i = 0; i < dim; i++)                                /* FOR 3 ops */
      {
         L_tmp_corr    = L_shl(L_mac(*L_xy_ptr,1,x_abs[i]), corr_up_shift );/* actual inloop WC value */
         Mpy_32_32_ss(L_tmp_corr,L_tmp_corr, &L_tmp_corr_sq, &UL_dummy);
         /* CorrSq 32 bits,4 ops */
         L_tmp_en = L_mac(*L_yy_ptr, 1, y[i]);      /* Q1,energy may span up to sign+19 bits , 1 op   */
         /* For highest accuracy use pairs of maximum upshifted 32x32 bit signed values            */
         /* (L_tmp_corr_sq / L_tmp_en)   > (L_corr_sq_max/L_en_max_den)                */
```

APPENDIX 1-continued

Exemplary implementation of embodiment in ANSI-C code
Below is an example of an implementation of an exemplifying embodiment in ANSI
C-code using STL 2009 G.191 virtual 16/32 bit (a simulation of a DSP).

```
        /* (L_tmp_corr_sq * L_en_max_den) > (L_corr_sq_max * L_tmp_en)          */
        Mpy_32_32_ss( L_en_max_den, L_tmp_corr_sq, &L_left_h, &UL_left_l);    /* 4 ops */
        Mpy_32_32_ss( L_tmp_en, L_corr_sq_max, &L_right_h, &UL_right_l);      /* 4 ops */
        /* 32/64 bit comparison WC (1+1+ 2x2+ 4 +(2+2+1) = 15                    */
        L_tmp = L_sub(L_left_h, L_right_h);       /* high signed word check      1 op */
        UL_tmp = UL_subNs(UL_right_l, UL_left_l, &u_sgn);
        /* low unsigned word check, note switch due to ">=" in UL_subNs, 1 op */
        IF( ( L_tmp > 0 ) || ( (L_tmp == 0) && (u_sgn != 0 ) ) )  /* IF 4 ops */
        {
          L_corr_sq_max = L_tmp_corr_sq; move32( ); /* 2 ops */
          L_en_max_den = L_tmp_en;       move32( ); /* 2 ops */
          imax         = i;              move16( ); /* 1 op */
        }
      } /* dim loop */
    }
    /* finally add found unit pulse contribution to past L_xy, Lyy, for next pulse loop */
    *L_xy_ptr = L_mac(*L_xy_ptr, x_abs[imax], 1);   /* xy_flt += xabs[imax]; Q12+1 */
    *L_yy_ptr = L_mac(*L_yy_ptr, 1, y[imax]);       /* yy_flt += y[imax];          */
    y[imax]        = add(y[imax],1);       move16( );   /* Q0 added pulse           */
    (*pulse_tot_ptr) = add((*pulse_tot_ptr) ,1);        /* increment total pulse sum */
    return imax;
}
/*---------------------------------------------------------------*
* Function pvq_encode_fx( )                           *
*                                                     *
* Basic PVQ search algorithm:                         *
* Selective L1-norm projection to the lower ~(K-1) pyramid  *
* followed by an ACELP-like unit pulse addition fine search  *
*---------------------------------------------------------------*/
void pvq_encode_fx(
  Encoder_State_fx *st_fx,
  const Word16 *x,     /* i: vector to quantize        Q15-3=>Q12    */
  Word16 *y,           /* o: raw pulses (non-scaled short) Q0        */
  Word16 *xq,          /* o: quantized vector          Q15           */
  const short pulses,  /* i: number of allocated pulses              */
  const short dim,     /* i: Length of vector == N                   */
  const Word16 neg_gain  /* i: -Subvector Gain we use -negative gain in Q15 0..1 */
)
{
  Word16 i;
  Word16 pulse_tot;
  Word16 xabs[PVQ_MAX_BAND_SIZE];
  Word16 max_xabs;
  Word32 L_xsum;
  Word32 L_proj_fac;
  Word32 L_yy, L_xy;
  Word16 max_amp_y, imax;
  Word16 k, en_margin, en_dn_shift, high_prec_active ;
  Word32 L_num, L_tmp;
  Word16 proj_fac, tmp, shift_den,shift_num,shift_delta, num,den;
  UWord16 u16_tmp;
  Word16 dim_m1;
  Word32 L_isqrt;
  Word16 neg_gain_norm, shift_tot;
  Word16  high_pulse_density_flag;
  PvqEntry_fx entry;
  /* Create absolute vector and calculate sum of abs vector */
  L_xsum = L_deposit_h(0);
  max_xabs = -1;           move16( );
  FOR( i = 0; i < dim; i++)
  {
    xabs[i]  = abs_s(x[i]);   move16( );        /* Q12 */
    max_xabs = s_max(max_xabs, xabs[i] );   /* for efficient search correlation scaling */
    L_xsum   = L_mac0(L_xsum, 1, xabs[i] );      /* stay in Q12 */
    y[i]     = 0;             move16( );    /* init */
  }
  test( );
  IF( L_xsum == 0 || neg_gain == 0 )
  { /* zero input or zero gain case */
    /* put a "half"-pulsesum first and last, or all pulses in pos 0 */
    pulse_tot = pulses;       move16( );
    dim_m1    = sub(dim,1);
    y[dim_m1] = 0;            move16( );
    y[0]      = shr(pulses,1); move16( );
    y[dim_m1] = add(y[dim_m1], sub(pulses, y[0]));  move16( );
    L_yy      = L_mult(y[0],y[0]); /* L_yy needed for normalization */
```

APPENDIX 1-continued

Exemplary implementation of embodiment in ANSI-C code
Below is an example of an implementation of an exemplifying embodiment in ANSI
C-code using STL 2009 G.191 virtual 16/32 bit (a simulation of a DSP).

```
    if(dim_m1 != 0) {
       L_yy = L_mac(L_yy, y[dim_m1],y[dim_m1]);  /* (single basop) */
    }
  }
}
ELSE
{ /* regular search */
  /* proj_fac_flt = (pulses - 1)/xsum_flt; */ /* normalize to L1 norm = absolute k-1 pyramid */
  num = sub(pulses,1);
  high_pulse_density_flag = 0; move16( );
  if ( sub(pulses, shr(dim, 1)) > 0 )
  {
     high_pulse_density_flag = 1; move16( );
  }
  test( );
  IF( (num > 0) && (high_pulse_density_flag != 0) )
  {
     shift_den = norm_l(L_xsum);                /* x_sum input Q12         */
     den       = extract_h(L_shl(L_xsum, shift_den)); /* now in Q12+shift_den    */
     L_num     = L_deposit_l(num);
     shift_num = sub(norm_l(L_num) ,1);
     L_num     = L_shl(L_num, shift_num) ;      /* now in Q0 +shift_num -1  */
     proj_fac  = div_l(L_num, den );            /* L_num always has to be less than den<<16 */
     shift_delta=sub(shift_num,shift_den);
     L_proj_fac = L_shl(L_deposit_l(proj_fac), sub(9, shift_delta)); /* bring to a fixed Q12 */
  }
  pulse_tot = 0;             move16( );
  L_yy = L_deposit_l(0);
  L_xy = L_deposit_l(0);
  /* Find a start position on a lower sub pyramid, if the pulse density is larger than 0.5 */
  IF((num > 0) && (high_pulse_density_flag != 0) )
  {
     FOR( i = 0; i < dim ; i++) /* max 64 */
     {
        /* y_flt[i] = (short)floor(xabs_flt[i] * proj_fac_flt); */  /* FLOAT pyramid truncation */
        /* y[i]     = shr(xabs[i]*L_proj_fac);           */  /* BASOP pyramid truncation */
        Mpy_32_16_ss(L_proj_fac,xabs[i],&L_tmp,&u16_tmp);        /*Q12 *Q12 +1 */
        y[i]      = extract_l(L_shr( L_tmp, 12+12-16+1 )); move16( ); /* the pyramid-"truncation" */
                                                            /* Q12 *Q12 -> Q0 */
        pulse_tot = add(pulse_tot, y[i]);       /* Q0                      */
        L_yy   = L_mac(L_yy, y[i], y[i]);       /* Energy, result will scale up by 2 by L_mac */
        L_xy   = L_mac(L_xy, xabs[i], y[i]);    /* Corr, Q0*Q12 +1 --> Q13           */
     }
  }
}
/* PVQ fine search loop description          */
/* Run an ACELP-like full CorrSq/Energy search */
/* the basic search logic is to test adding one unit pulse to each position n in the output vector y
   and update the correlation and energy terms iteratively.
   Rxy(k,n)   = Rxy(k-1) + 1*abs(x(k,n))    % add target times unit correlation
   Ryy(k,n)   = Ryy(k-1) + 2*y(k-1,n) + 1^2 % added unit energy contribution
   RxySq(k,n) = Rxy(k,n)*Rxy(k,n)
   minimize ( -Rxy(k,n)/Sqrt(Ryy(k,n)) ),    over n and k
   ( or equiv. maximize ( RxySq(k,n)/Ryy(k,n) ), over n and k )
      RxySq(k,n)            bestRxySq
      ----------    >       ---------           ? update best candidate
      Ryy(k,n)              bestRyy
      bestRyy * RxySq(k,n) > bestRxySq * Ryy(k,n) ? update best candidate
   Misc:
     1^2 in Ryy(k,n) can be added before the dimension loop
     Ryy(k,n) can optionally be pre down-scaled by 2.0 to avoid one multiplication/shift
     Rxy(k,n) can dynamically scaled for each unit pulse loop to optimize RxySq.
     CorrSqTerm =(Rxy(k,n))^2, should have maximum precision in a Word16/Word32 variable
     Energy term:Ryy(k, n)
       should not become zero, i.e. most often have enough precision to not become truncated
       i.e. preferably use a 32 bit variable if more than 127 pulses are accumulated in Q1.
       k=127=>log2(127^2 ) = 13.9774 bits, fits in Q1 signed, with Q1 the pre division by 2 works
       k=255=>log2(255^2 ) = 15.9887 bits, i.e 1 bits scaling, fits in Q1 unsigned 16 bit value
     Dimension aspects:
       dim 6 and higher is always 16 bit energy safe as max pulses is 96
          (for 1+31 bits short codewords)
       dims 5,4,3,2 may be allocated higher than 127 pulses (or lower)
       dim 1 does not really need a search, only the sign is relevant.
       Currently we have KMAX=512, or more precisely for DIM 5   kmax is 238
                             DIM 4,3,2,1 kmax is 512
     Unsigned DSP arithmetic could also be used,
       but then the "startup" case/ now a negative sentinel has to be handled in a special way
       and further currently UL_mac,UL_mac0,UL_msu,UL_msu0 is not available as STL unsigned
```

APPENDIX 1-continued

Exemplary implementation of embodiment in ANSI-C code
Below is an example of an implementation of an exemplifying embodiment in ANSI
C-code using STL 2009 G.191 virtual 16/32 bit (a simulation of a DSP).

basops

```
                To make the PVQ search code work efficiently we do:
                    1. Always use near optimal norm_1 based dynamic up-scaling of the correlation term,
                       by analyzing the accumulated correlation sofar. (Rxy for k-1 pulses)
                       and using a pre-analyzed maximum possible target value  max_xabs.
                    2. Selectively use 16 or 32 bit representation of the energy term,
                       depending on the pre-accumulated energy.
                       further if the energy term Ryy needs more than 16 bits, we switch to a 32 bit
                       energy representation
                       and also a higher 32 bit precision for the correlation Rxy and
                       increase the precision in the distortion cross-multiplication calculations
                       to near 64 bits.
            */
        /* Rxy_max=(k,*)= max( L_xy + 1*max_x_abs)
            analysis needed for near optimal L_xy normalization (corr, corrSq)   */
        /* Ryy_max(k,*) = max(L_yy(k-1) + .5 + 1*max_amp_y(k-1))
            analysis needed for energy (L_yy) precision selection when pulses > 127 ,
            ( (127^2)*2 fits in Signed Word16) */
                L_yy=L_shr(L_yy,1); /* scale down by 2 for search loop domain */
                IF (sub(pulses,127)<=0 )
                { /* LC inner loop, enters here always for dimensions 6 and higher,
                       and also sometimes for dimensions 1 .. 5 */
                    /* ( if high energy precision is inactive, max_amp_y is not needed ,
                       no max_amp_y(k-1) update )      */
                    FOR (k=pulse_tot; k<pulses;k++){
                       L_yy = L_add(L_yy,1); /* .5 added to energy for pulse_tot+1*/
                       imax = one_pulse_search(dim, xabs,y,&pulse_tot,&L_xy,&L_yy,0, 0,max_xabs);
                    }
                }
                ELSE
                { /* HC or LC+HC inner loops */
                    max_amp_y = max_val_fx(y, dim); /* this loops over max 5 values */
                    /* max_amp_y from projected y is needed when pulses_sum exceeds 127    */
                    /* First section with 32 bit energy inactive, max_amp_y kept updated though  */
                    FOR( k=pulse_tot; k<128; k++){
                       L_yy    = L_add(L_yy,1);                /* .5 added */
                       imax    = one_pulse_search(dim, xabs,y,&pulse_tot,&L_xy,&L_yy,0,0,max_xabs);
                       max_amp_y = s_max(max_amp_y, y[imax]);
                    }
                    /* Second section with higher number of pulses, 32 bit energy precision adaptively
                       selected, max_amp_y kept updated      */
                    FOR( k=pulse_tot; k<pulses; k++){
                       L_yy    = L_add(L_yy,1);  /* .5 added   */
                       en_margin = norm_l(L_mac(L_yy,1, max_amp_y)); /*find max "addition", margin,~2 ops
*/
                       en_dn_shift = sub(16, en_margin); /* calc. shift to lower word */
                       high_prec_active = 1;  move16( );
                       if( en_dn_shift <= 0 ){ /* only use 32 bit energy if actually needed */
                            high_prec_active = 0;  move16( );
                       }
                       /* 32 bit energy and corr adaptively active, max_amp_y kept updated */
                       imax    = one_pulse_search(dim,xabs,y,&pulse_tot,&L_xy,&L-yy,high_prec_active,
                                       en_dn_shift, max_xabs);
                       max_amp_y = s_max(max_amp_y, y[imax]);
                    }
                }
                L_yy = L_shl(L_yy,1); /* yy= yy*2.0 */ /* compensate search loop analysis energy downshift by
                                               1,  to make energy right for unit/inverse gain calculation */
        }
/* Apply unit energy (L2) normalization scaling, always at least one pulse so no div-by-zero check is
    needed */
    L_isqrt     = L_deposit_l(0);
    IF( neg_gain != 0 ){
       L_isqrt = Isqrt(L_shr(L_yy,1));   /* Note: one single gain factor as in flt is not computed */
    }
    shift_num   = norm_s(pulse_tot);             /* account for max possible pulse amplitude in y,
                                               can be used even when max_amp_y is not avail. */
    shift_den  = norm_s(neg_gain);           /* account for gain downscaling shift  */
    neg_gain_norm = shl(neg_gain, shift_den);    /* up to 10 dB loss without this norm  */
    shift_tot   = sub(add(shift_num, shift_den), 15);
    /* DSP OPT : to save average complexity a special loop can be made for the common gain==1.0
case */
    /* DSP OPT PROM : reuse a common decoder normalization loop                 */
    L_isqrt = L_negate(L_isqrt);
    FOR( i = 0; i < dim; i++)
    {
```

APPENDIX 1-continued

Exemplary implementation of embodiment in ANSI-C code
Below is an example of an implementation of an exemplifying embodiment in ANSI
C-code using STL 2009 G.191 virtual 16/32 bit (a simulation of a DSP).

```
    tmp = shl(y[i],shift_num);   /* upshifted abs(y[i]) used in scaling */
    if( x[i] < 0 )
    {
       tmp = negate(tmp);                        /* apply sign */
    }
    if( y[i] != 0 )
    {
       y[i]    = shr(tmp, shift_num);   move16( );  /* updates sign of y[i],~range -/+ 512),array move */
    }
    Mpy_32_16_ss( L_isqrt, tmp, &L_tmp, &u16_tmp);      /* Q31*Q(0+x) +1      */
    Mpy_32_16_ss( L_tmp, neg_gain_norm , &L_tmp, &u16_tmp);  /* Q31*Q(0+x) *Q15 +1  */
    L_tmp = L_shr(L_tmp, shift_tot);                /* Q31+x            */
    xq[i] = round_fx(L_tmp);      move16( );        /* Q15, array move     */
    L_xq[i] = L_tmp;                                /* Q31 currently unused */
  }
  /* index the found PVQ vector into short codewords */
  entry = mpvq_encode_vec_fx(y, dim, pulses);
  /* send the short codeword(s) to the range encoder */
  rc_enc_bits_fx(st_fx, UL_deposit_l(entry.lead_sign_ind) , 1); /* 0 or 1 */
  IF( sub( dim, 1) != 0 )
  {
     rc_enc_uniform_fx(st_fx, entry.index, entry.size);
  }
  return;
```

The above code should be easy to read for all persons skilled in the art and should not have to be explained more in detail. However, for the non-skilled person it is mentioned that the relational operator "==" is an operator which in an example of "A==B" returns a logical value set to logical 1 (true) when values A and B are equal; and otherwise returns logical 0 (false). L_mac is a multiply-accumulate within the meaning that L_mac (L_v3, v1, v2)=L_v3+v1*v2.

APPENDIX 2

Tabled Simulation Results

Simulation Background

Embodiments of the disclosure herein have been simulated. For all PVQ-shape-search simulations made, the bit rate used was 64000 bps, and the codec was operated in MDCT mode, with initial MDCT coefficient sub-band sizes of [8, 12, 16, 24, 32] coefficients. These bands may very well be divided into smaller band sections, each represented by a sub vector, by a PVQ band splitting-algorithm. For example, a band of size 8 may be split into smaller sub-section, e.g. "4, 4" or "3,3,2", if it is allocated enough bits. Typically, each band is split in such a way that a maximum of 32 bits may be used for shape coding of every final sub-vector.

In this PVQ-indexing implementation a band of size 8 may have up to 36 unit pulses, a sub section of size 7 may have up to 53 unit pulses, a section of size 6 may have up to 95 unit pulses, a section of size 5 may have up to 238 unit pulses, a section of size 4,3,2,1 may have up to 512 unit pulses. As the shorter sections with a high number of pulses are created dynamically by band-splitting, they are more infrequent than the longer sub vector sizes. The WMOPS figures in the Result Tables below include: (PVQ-pre-search, PVQ-fine search, PVQ-normalization and PVQ-indexing.). The "% identical" figures in the Result Tables below, is the number of identical vectors found in the evaluated limited precision shape search Algorithm, compared to an unconstrained floating point PVQ shape search.

Result Tables

TABLE 1

| Results for final K <= 127 | | | | | | |
|---|---|---|---|---|---|---|
| Pulses <= 127, Algorithm En{energy-bits} x CorrSq{corrSq-bits} | Min SNR (dB) | Seg-SNR (dB) | % identical vectors | Worst Case WMOPS | Average WMOPS | Remark |
| Mixed "En16 x CorrSq16"/"En32 x CorrSq32", pre_analyze max(x_abs) | 4.771 | 188.803 | 99.3 | 6.843 | 5.496 | 16 x 16 always used, WC (worst case) in 16 x 16 |
| Locked "En16 x CorrSq16" pre_analyze max(x_abs) | 4.771 | 188.803 | 99.3 | 6.843 | | No change as energy never exceeds 16 bits |
| "En16 x CorrsSq16" using a known art correlation scaling method "OPUS", using accumulated number of unit pulses. | −6.021 | 180.556 | 94.6 | 6.826 | 5.476 | Algorithm is bit worse (lower minSNR less identical hits,) at very similar complexity |

TABLE 1-continued

Results for final K <= 127

| Pulses <= 127, Algorithm En{energy-bits} × CorrSq{corrSq-bits} | Min SNR (dB) | Seg-SNR (dB) | % identical vectors | Worst Case WMOPS | Average WMOPS | Remark |
| --- | --- | --- | --- | --- | --- | --- |
| Locked "En32 × CorrSq16", pre-analyze max(x_abs) | 4.771 | 188.803 | 99.3 | 8.970 | 6.961 | Unnecessary to Use En32 for pulses <=127, as energy never exceeds 16 bits dynamics |
| Locked "En16 × CorrSq32", pre-analyze input max(x_abs) | 190.0 | 190.0 | 100 | 9.386 | 7.248 | 2.5 WMOPS extra required for the last 0.7% hits |
| Locked "En32 × CorrSq32", pre-analyze max(x_abs) | 190.0 | 190.0 | 100 | 10.474 | 7.999 | Unnecessary 0.9 WMOPS increase compared to Locked "En16 × CorrSq32", |

TABLE 2

Results for K > 127

| Pulses > 127 Algorithm En{energy-bits} × CorrSq{corrSq-bits} | minSNR (dB) | segSNR (dB) | % identical vectors | Worst Case-WMOPS | Average-WMOPS | Remark |
| --- | --- | --- | --- | --- | --- | --- |
| Mixed AccEn controlled "En16 × CorrSq16"/ "En32 × CorrSq32", pre_analyze input, acc. energy controlled precision | 32.686 | 160.316 | 80.4% | 6.843 (WC still from 16 × 16 sections) | 5.496 | A good enough solution WC is still for 16 × 16, WC is not increased |
| Mixed AccEn controlled "En16 × CorrSq16"/ "En16 × CorrSq32" pre_analyze input, acc. energy controlled precision | 32.686 | 130.258 | 59.3% | n/a | n/a | Energy information is occasiionaly truncated, causing low SNR |
| Mixed AccEn controlled "En16 × CorrSq16"/ "En32 × CorrSq16" pre_analyze input, acc. energy controlled precision | 32.686 | 117.634 | 50.6% | n/a | n/a | Correlation information has low precision, causing low SNR |
| Locked "En16 × CorrSq16", pre_analyze input, | 32.686 | 113.629 | 47.8% | n/a | n/a | Energy information occasionaly truncated and correlation in information has low precission, causing low SNR |
| Locked "En32 × CorrSq16", pre_analyze input | 32.686 | 117.634 | 50.6% | n/a | n/a | Correlation information has low precision, causing low SNR |
| Locked "En16 × CorrSq32", pre_analyze input | 40.994 | 159.714 | 78.8% | n/a | n/a | Energy information is occasiionaly truncated, causing low SNR |

TABLE 2-continued

Results for K > 127

| Pulses > 127 Algorithm En{energy-bits} x CorrSq{corrSq-bits} | minSNR (dB) | segSNR (dB) | % identical vectors | Worst Case-WMOPS | Average-WMOPS | Remark |
|---|---|---|---|---|---|---|
| Locked "En32 x CorrSq32", pre_analyze input | 49.697 | 189.773 | 99.8% | 7.1 | 5.7 | WC now in 32 × 32 section, higher complexity WC |

The invention claimed is:

1. A method for Pyramid Vector Quantizer, (PVQ) shape search, performed by an audio encoder including a digital signal processor, the method comprising:
the digital signal processor receiving a target vector x as input;
the digital signal processor deriving a vector y using the target vector x by iteratively adding unit pulses in an inner dimension search loop;
before entering a next inner dimension search loop for unit pulse addition, the digital signal processor determining, (i) based on a maximum pulse amplitude, $maxamp_y$, of a current vector y, whether more than a current bit word length is needed to represent, in a lossless manner, a variable, $enloop_y$, related to an accumulated energy of y, in the next inner dimension search loop, and (ii) based on a maximum absolute value, $xabs_{max}$, of the input vector, x, a possible upshift, in a bit word, of the next loop's accumulated in-loop correlation value, $corr_{xy}$, between x and the vector y;
the digital signal processor executing, in accordance with the determined current bit word length and the determination of the possible shift, the next inner dimension search loop for deriving the vector y, wherein
executing the next inner dimension search loop comprises:
the digital signal processor determining a position, $n_{best}$ in y for addition of a unit pulse by evaluating a cross-multiplication, for each position n in y, of a correlation and energy value for the current n; and a squared correlation, BestCorrSq and an energy value, bestEn, saved from previous values of n, as:

$$corr_{xy}^2 * bestEn > BestCorrSq * enloop_y$$

where $$\left.\begin{array}{l} n_{best} = n \\ bestEn = enloop_y \\ BestCorrSq = corr_{xy}^2 \end{array}\right\} \text{ when } corr_{xy}^2 * bestEn >$$

$$BestCorrSq * enloop_y,$$

and
the digital signal processor executes the next inner dimension search loop using a longer bit word length to represent a squared accumulated in-loop correlation value, $corr_{xy}^2$, between x and the vector y, in the inner loop as a result of determining that more than the current bit word length is needed to represent $enloop_y$.

2. The method according to claim 1, further comprising:
in response to determining that more than the current bit word length is needed to represent $enloop_y$, the digital signal processor performing the next inner dimension search loop using a longer bit word length to represent $enloop_y$.

3. The method according to claim 1, further comprising:
in response to determining that more than the current bit word length is not needed to represent $enloop_y$:
the digital signal processor performing the next inner dimension search loop by employing a first unit pulse addition loop using a first bit word length to represent $enloop_y$; and
in response to determining that more than the current bit word length is needed to represent $enloop_y$: the digital signal processor performing the next inner dimension search by employing a second unit pulse addition loop using a longer bit word length to represent $enloop_y$ than the first unit pulse addition loop.

4. The method according to claim 1, further comprising:
in response to determining that more than the current bit word length is not needed to represent $enloop_y$:
the digital signal processor performing the next inner dimension search by employing a first unit pulse addition loop having a certain precision; and
in response to determining that more than the current bit word length is needed to represent $enloop_y$: the digital signal processor performing the next inner dimension search by employing a second unit pulse addition loop having a higher precision than the first unit pulse addition loop.

5. The method according to claim 1, wherein the determining, based on $maxamp_y$, of whether more than the current bit word length is needed to represent $enloop_y$ comprises the digital signal processor determining characteristics of the case when, in the next inner search loop, the unit pulse is added to the position in y being associated with $maxamp_y$.

6. The method according to claim 1, further comprising:
the digital signal processor keeping track of $maxamp_y$ when a final value of K, associated with the target vector x, exceeds a threshold value.

7. The method according to claim 1, the method further comprising the digital signal processor executing the next inner dimension search loop in accordance with the determination whether more than the current bit word length is needed to represent the variable $enloop_y$.

8. An audio encoder configured for Pyramid Vector Quantization (PVQ) shape search, the audio encoder comprising:
a digital signal processor coupled to the memory, the processor configured to:
receive a target vector x as input, derive a vector y using the target vector x by iteratively adding unit pulses in an inner dimension search loop, before entering a next inner dimension search loop for unit pulse addition, determine, (i) based on a maximum pulse amplitude, maxamp$_y$, of a current vector y, whether more than a current bit word length is needed to represent, in a lossless manner, a variable, enloop$_y$, related to an accumulated energy of y, in the next inner dimension search loop, and (ii) based on a maximum absolute value, xabs$_{max}$, of the input vector, x, a possible upshift, in a bit word, of the next loop's accumulated in-loop correlation value, corr$_{xy}$, between x and the vector y, execute, in accordance with the determined current bit word length and the determination of the possible shift, the next inner dimension search loop for deriving the vector y, wherein the processor is configured to execute the next inner dimension search loop by performing steps comprising:

determining a position, n$_{best}$ in y for addition of a unit pulse by evaluating a cross-multiplication, for each position n in y, of a correlation and energy value for the current n; and a squared correlation, BestCorrSq and an energy value, bestEn, saved from previous values of n, as:

$$\text{corr}_{xy}^2 * bestEn > BestCorrSq * enloop_y$$

where $$\left.\begin{array}{l} n_{best} = n \\ bestEn = enloop_y \\ BestCorrSq = \text{corr}_{xy}^2 \end{array}\right\} \text{ when } \text{corr}_{xy}^2 * bestEn >$$

$$BestCorrSq * enloop_y,$$

and using a longer bit word length to represent a squared accumulated in-loop correlation value, corr$_{xy}^2$, between x and the vector y, in the inner loop as a result of determining that more than the current bit word length is needed to represent enloop$_y$.

9. The audio encoder according to claim 8, the digital signal processor further configured to:

perform the next inner dimension search loop using a longer bit word length to represent enloop$_y$ in response to determining that more than the current bit word length is needed to represent enloop$_y$.

10. The audio encoder according to claim 8, the digital signal processor further configured to:

perform the next inner dimension search loop by employing a first unit pulse addition loop using a first bit word length in response to determining that more than the current bit word length is not needed to represent enloop$_y$, and perform the next inner dimension search loop by employing a second unit pulse addition loop using a longer bit word length than the first unit pulse addition loop in response to determining that more than the current bit word length is needed to represent enloop$_y$.

11. The audio encoder according to claim 8, the digital signal processor further configured to:

perform the next inner dimension search loop by employing a first unit pulse addition loop, having a certain precision, in response to determining that more than the current bit word length is not needed to represent enloop$_y$; and perform the next inner dimension search loop by employing a second unit pulse addition loop, having a higher precision than the first unit pulse addition loop, in response to determining that more than the current bit word length is needed to represent enloop$_y$.

12. The audio encoder according to claim 8, wherein the determining, based on maxamp$_y$, of whether more than the current bit word length is needed to represent enloop$_y$ further includes the processor configured to determine characteristics of the case when, in the next inner search loop, the unit pulse is added to the position in y being associated with maxamp$_y$.

13. The audio encoder according to claim 8, the digital signal processor further configured to keep track of maxamp$_y$ when a number of final unit pulses, K, associated with the target vector x, exceeds a threshold value.

14. A communication device comprising the audio encoder according to claim 8.

15. A non-transitory computer readable medium including instructions stored therein which, when executed on at least one digital signal processor, causes the at least one digital signal processor to carry out the method according to claim 1.

16. The audio encoder according to claim 8, wherein the digital signal processor is further configured to execute the next inner dimension search loop in accordance with the determination whether more than the current bit word length is needed to represent the variable enloop$_y$.

17. An audio encoder configured for Pyramid Vector Quantization (PVQ) shape search, the audio encoder comprising:

a first determining unit coupled to a memory, the first determining unit configured to:

receive a target vector x as input;

derive a vector y using the target vector x by iteratively adding unit pulses in an inner dimension search loop;

before entering a next inner dimension search loop for unit pulse addition:

determine, (i) based on a maximum pulse amplitude, maxamp$_y$, of a current vector y, whether more than a current bit word length is needed to represent, in a lossless manner, a variable, enloop$_y$, related to an accumulated energy of y, in the upcoming inner dimension loop, and (ii) based on a maximum absolute value, xabs$_{max}$, of the input vector, x, a possible upshift, in a bit word, of the next loop's accumulated in-loop correlation value, corr$_{xy}$, between x and the vector y, and execute, in accordance with the determined current bit word length and the determination of the possible shift, the next inner dimension search loop for deriving the vector y in accordance with the determination of the possible shift, wherein the audio encoder further comprises a fine search unit configured to, in the next inner dimension search loop for unit pulse addition, determine a position, n$_{best}$, in y for addition of a unit pulse by evaluating a cross-multiplication, for each position n in y, of a correlation and energy value for the current n; and a correlation, BestCorrSq, and energy value, bestEn, saved from previous values of n, as:

$$\text{corr}^2_{xy} * bestEn > BestCorrSq * enloop_y \quad 5$$

where $$\left.\begin{array}{l} n_{best} = n \\ bestEn = enloop_y \\ BestCorrSq = \text{corr}^2_{xy} \end{array}\right\} \text{ when } \text{corr}^2_{xy} * bestEn >$$

$$BestCorrSq * enloop_y,$$

and the fine search unit is further configured to use a longer bit word length to represent a squared accumulated in-loop correlation value, $\text{corr}_{xy}^2$, between x and the vector y, in the inner loop as a result of determining that more than the current bit word length is needed to represent $enloop_y$.

18. The audio encoder according to claim 17, further comprising a fine search unit configured to perform the next inner dimension search loop using a longer bit word length to represent $enloop_y$, in response to determining that more than the current bit word length is needed to represent $enloop_y$.

19. The audio encoder according to claim 17, further comprising a fine search unit configured to:
perform the next inner dimension search loop by employing a first unit pulse addition loop using a first bit word length in response to determining that more than the current bit word length is not needed to represent $enloop_y$, and
perform the next inner dimension search loop by employing a second unit pulse addition loop using a longer bit word length than the first unit pulse addition loop in response to determining that more than the current bit word length is needed to represent $enloop_y$.

20. The audio encoder according to claim 17, further comprising a fine search unit configured to:
perform the next inner dimension search loop by employing a first unit pulse addition loop, having a certain precision, in response to determining that more than the current bit word length is not needed to represent $enloop_y$; and
perform the next inner dimension search loop by employing a second unit pulse addition loop, having a higher precision than the first unit pulse addition loop, in response to determining that more than the current bit word length is needed to represent $enloop_y$.

21. The audio encoder according to claim 17, the first unit further configured to perform the determining, based on $maxamp_y$, of whether more than the current bit word length is needed to represent $enloop_y$ by determining characteristics of the case when, in the next inner search loop, the unit pulse is added to the position in y being associated with $maxamp_y$.

22. The audio encoder according to claim 17, further comprising a storing unit configured to keep track of $maxamp_y$ when a number of final unit pulses, K, associated with the target vector x, exceeds a threshold value.

23. A communication device comprising the audio encoder according to claim 17.

24. The audio encoder according to claim 17, wherein the digital signal processor is further configured to execute the next inner dimension search loop in accordance with the determination whether more than the current bit word length is needed to represent the variable $enloop_y$.

* * * * *

UNITED STATES PATENT AND TRADEMARK OFFICE
CERTIFICATE OF CORRECTION

PATENT NO. : 9,792,922 B2
APPLICATION NO. : 14/759864
DATED : October 17, 2017
INVENTOR(S) : Svedberg It is certified that error appears in the above-identified patent and that said Letters Patent is hereby corrected as shown below:

On the Title Page

In the Figure, delete " 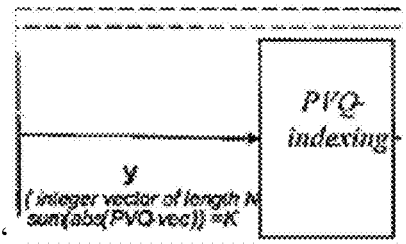 " and insert " 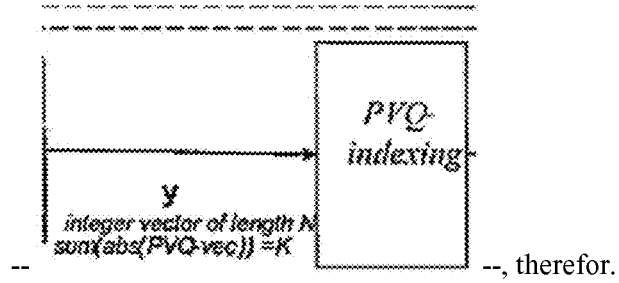 --, therefor.

In the Figure, delete " " and insert " --, therefor.

Signed and Sealed this
Fifth Day of June, 2018

Andrei Iancu
*Director of the United States Patent and Trademark Office*

In the Drawings
In Fig. 7, Sheet 5 of 10, delete " 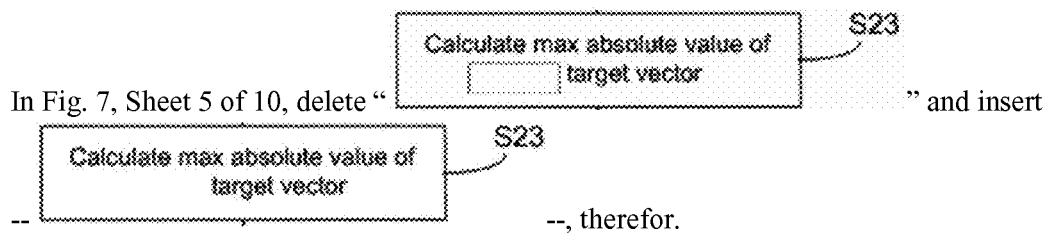 " and insert -- , therefor.
In Fig. 7, Sheet 5 of 10, delete " energy " and insert -- energy --, therefor.
In Fig. 7, Sheet 5 of 10, delete " 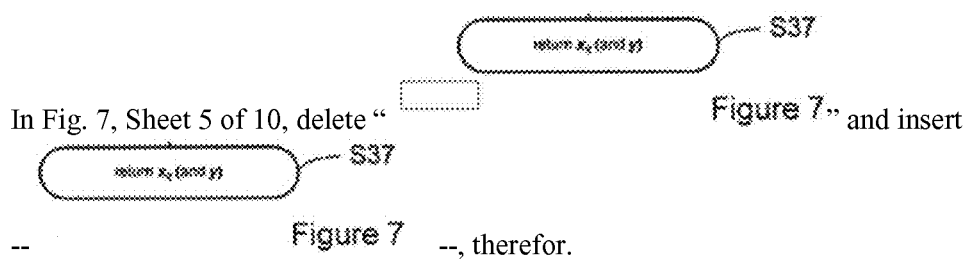 Figure 7." and insert -- Figure 7 --, therefor.
In Fig. 12, Sheet 10 of 10, delete " 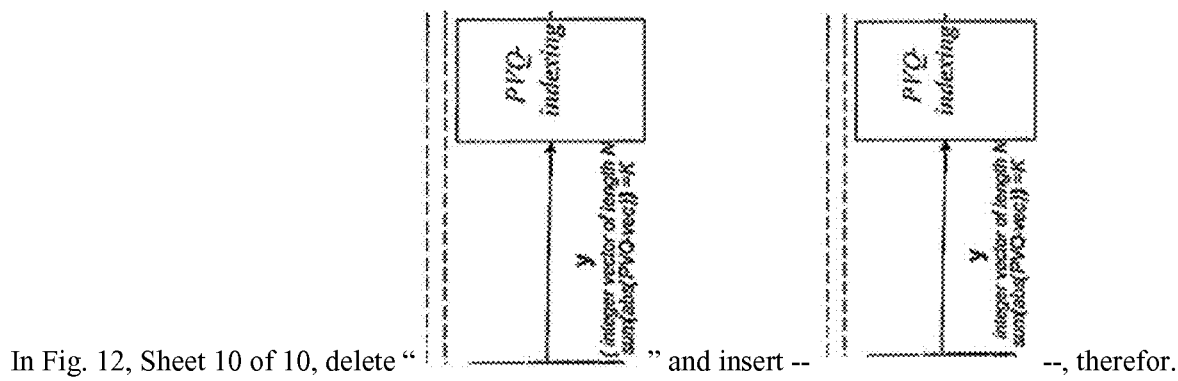 " and insert -- --, therefor.
In Fig. 12, Sheet 10 of 10, delete " 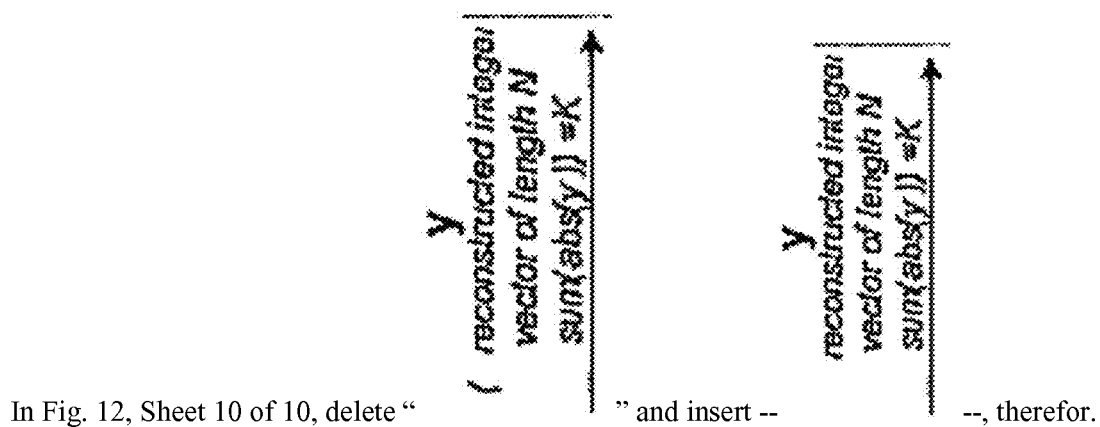 " and insert -- --, therefor.

CERTIFICATE OF CORRECTION (continued)
U.S. Pat. No. 9,792,922 B2

In the Specification

In Column 5, Lines 24-25, delete "device, and" and insert -- device. --, therefor.

In Column 5, Line 28, delete "FIG. 11a-c" and insert -- FIGS. 11a-c --, therefor.

In Column 5, Line 63, delete "et. al," and insert -- et al., --, therefor.

In Column 6, Line 5, delete "et. al.," and insert -- et al., --, therefor.

In Column 6, Line 6, delete "et. al." and insert -- et al. --, therefor.

In Column 6, Line 51, delete "$Q_{PVG}$" and insert -- $Q_{PVQ}$ --, therefor.

In Column 7, Line 55, delete "$Q_{PVG}$" and insert -- $Q_{PVQ}$ --, therefor.

In Column 11, Line 38, delete "approach." and insert -- approach: --, therefor.

In Column 12, Line 65, delete "highprecision$_{active}$=TRUE,if($en_{margin}$<16)(Eq23)" and insert -- $highprecision_{active} = TRUE, if(en_{margin} < 16)$     (Eq23) --, therefor.

In Column 13, Line 2, delete "STS" and insert -- STL --, therefor.

In Column 16, Line 65, delete "enloopy" and insert -- $enloop_y$ --, therefor.

In Column 17, Line 63, delete "that could" and insert -- that ">" could --, therefor.

In Column 21, Lines 14-15, delete "($g_{max}$=max (G)=max ($g_o$ . . . g(Ns-1))." and insert -- $g_{max}$=max (G)=max ($g_o$ . . . $g_{(Ns-1)}$). --, therefor.

In Column 22, Line 40, delete "a determining/calculating/deciding/selecting" and insert -- determining/calculating/deciding/selecting --, therefor.

In Column 24, Line 2, delete "search, and" and insert -- search, --, therefor.

In Column 24, Line 62, delete "FIG. 5-6" and insert -- FIGS. 5-6 --, therefor.

In Column 25, Line 44, delete "above. if" and insert -- above. If --, therefor.

In Columns 29-30, under "APPENDIX 1", Line 4, delete "an near optimal correlation upscaling." and insert -- a near optimal correlation upscaling --, therefor.

In Column 38, Line 42, delete "PVQ-indexing.)." and insert -- PVQ-indexing). --, therefor.

In Columns 39-40, in Table 2, Line 28, delete "CorrSq16",," and insert -- CorrSq16", --, therefor.

In the Claims

In Column 41, Line 17, in Claim 1, delete "Quantizer," and insert -- Quantizer --, therefor.

In Column 41, Line 43, in Claim 1, delete "$n_{best}$" and insert -- $n_{best}$, --, therefor.

In Column 43, Line 21, in Claim 8, delete "$n_{best}$" and insert -- $n_{best}$, --, therefor.